(12) United States Patent
Fujita et al.

(10) Patent No.: US 8,674,370 B2
(45) Date of Patent: Mar. 18, 2014

(54) LIGHT EMITTING PANEL DEVICE WHEREIN A PLURALITY OF PANELS RESPECTIVELY HAVING LIGHT EMITTING SECTIONS ARE CONNECTED, AND IMAGE DISPLAY DEVICE AND ILLUMINATING DEVICE PROVIDED WITH THE LIGHT EMITTING PANEL DEVICE

(75) Inventors: Yoshimasa Fujita, Osaka (JP); Hidenori Ogata, Osaka (JP); Ken Okamoto, Osaka (JP); Yuhki Kobayashi, Osaka (JP); Makoto Yamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 118 days.

(21) Appl. No.: 13/500,287

(22) PCT Filed: May 20, 2010

(86) PCT No.: PCT/JP2010/058560
§ 371 (c)(1),
(2), (4) Date: May 18, 2012

(87) PCT Pub. No.: WO2011/043099
PCT Pub. Date: Apr. 14, 2011

(65) Prior Publication Data
US 2012/0228596 A1 Sep. 13, 2012

(30) Foreign Application Priority Data
Oct. 8, 2009 (JP) .................. 2009-234346

(51) Int. Cl.
*H01L 27/14* (2006.01)
(52) U.S. Cl.
USPC .......... 257/72; 257/59; 257/40; 257/E27.119; 257/E51.018
(58) Field of Classification Search
USPC .................. 257/40, 59, 72, E27.119, E51.018
See application file for complete search history.

(56) References Cited

U.S. PATENT DOCUMENTS 5,978,060 A * 11/1999 Nakawaki et al. ............ 349/150
6,642,542 B1    11/2003 Shimoda et al.
(Continued)

FOREIGN PATENT DOCUMENTS

JP    59-147176 U    10/1984
JP    62-146189 U    9/1987
(Continued)

OTHER PUBLICATIONS

International Search Report and Written Opinion received for PCT Patent Application No. PCT/JP2010/058560, mailed on Jul. 6, 2010, 15 pages (8 pages of English Translation and 7 pages of PCT Search Report).

(Continued)

*Primary Examiner* — Bilkis Jahan
(74) *Attorney, Agent, or Firm* — Morrison & Foerster LLP

(57) ABSTRACT

Panel (11) of the present invention includes substrate (12) having flat surface (12a') having rectangular display section (13), and adjacent surface (12b') curved from an edge part of surface (12a') in the vicinity of a long side of surface (12a'). On surface (12b'), terminals, extending from display section (13) (in the vicinity of the long side), are arranged. Edge parts of surfaces (12a') of substrates (12) of adjacent panels (11) are combined so that longitudinal directions of light-emitting sections (13) are parallel to each other. Surface (12b') projects on a back surface side of substrate (12). It is thus possible to provide a light-emitting panel device realizing a large light-emitting surface by combining a desired number of panels, an image display device including the light-emitting panel device, an illumination device including the light-emitting panel device, a panel in the light-emitting panel device, and a method of producing the panel.

18 Claims, 11 Drawing Sheets

(56) References Cited

U.S. PATENT DOCUMENTS

| | | | |
|---|---|---|---|
| 7,046,317 B2 * | 5/2006 | Hayashimoto et al. | 349/63 |
| 8,057,055 B2 * | 11/2011 | Iwamoto | 362/97.1 |
| 2003/0090198 A1 | 5/2003 | Aston | |
| 2004/0014252 A1 * | 1/2004 | Shimoda et al. | 438/22 |
| 2004/0051451 A1 | 3/2004 | Kawase et al. | |
| 2004/0080032 A1 | 4/2004 | Kimura et al. | |
| 2004/0256977 A1 | 12/2004 | Aston | |
| 2009/0185127 A1 * | 7/2009 | Tanaka et al. | 349/152 |
| 2009/0279282 A1 * | 11/2009 | Iwamoto | 362/97.1 |

FOREIGN PATENT DOCUMENTS

| | | |
|---|---|---|
| JP | 63-8781 U | 1/1988 |
| JP | 1-312587 A | 12/1989 |
| JP | 2001-100662 A | 4/2001 |
| JP | 2002-297066 A | 10/2002 |
| JP | 2004-6724 A | 1/2004 |
| JP | 2004-111059 A | 4/2004 |
| JP | 2005-509904 A | 4/2005 |
| JP | 2009-139463 A | 6/2009 |
| JP | 2009-158227 A | 7/2009 |
| WO | 03/042966 A1 | 5/2003 |

OTHER PUBLICATIONS

Shim at al., "Simulation Study for Seamless Imaging of OLED Tiled Display", International Display Workshops (IDW), 2008, pp. 173-176.

* cited by examiner

ORGANIC LAYER BECOMES THIN SO THAT LEAKAGE OCCURS BETWEEN FIRST AND SECOND ELECTRODES.

LIGHT EMITTING PANEL DEVICE WHEREIN A PLURALITY OF PANELS RESPECTIVELY HAVING LIGHT EMITTING SECTIONS ARE CONNECTED, AND IMAGE DISPLAY DEVICE AND ILLUMINATING DEVICE PROVIDED WITH THE LIGHT EMITTING PANEL DEVICE

CROSS REFERENCE TO RELATED APPLICATIONS

This is a U.S. National Phase patent application of PCT/JP2010/058560, filed May 20, 2010, which claims priority to Japanese Patent Application No. 2009-234346, filed Oct. 8, 2009, each of which is hereby incorporated by reference in the present disclosure in its entirety.

TECHNICAL FIELD

The present invention relates to: a light-emitting panel device in which a plurality of panels each having a light-emitting section are connected to each other; an image display device including the light-emitting panel device; and an illumination device including the light-emitting panel device. More specifically, the present invention relates to: an image display device having a large-screen organic EL display which is realized by causing a plurality of panels, each having an organic electroluminescence (EL) element in a display section, to be connected to each other; and an illumination device including the organic EL display.

BACKGROUND ART

In recent years, there has been growing demand for a flat panel display with an information network advanced. As the flat panel display, the following displays have been known, for example: a non light-emitting liquid crystal display (LCD), a light-emitting plasma display (PDP), an inorganic electroluminescence (inorganic EL) display, and an organic electroluminescence (EL) display. Among these flat displays, the organic EL display has been significantly advanced.

In a field of the organic EL display, the following two techniques have been known: (i) a technique of displaying a moving image by simple matrix driving, and (ii) a technique of displaying a moving image by causing organic EL elements to be subjected to active matrix driving with the use of a thin film transistor (TFT).

Further, according to a conventional display, a red pixel for emitting red light, a green pixel for emitting green light, and a blue pixel for emitting blue light are adjacently provided as one unit, so as to provide a full color image by creating various colors, e.g., a white color.

In order to provide such a full color image with the organic EL, generally, an organic light-emitting layer is painted in red, green, and blue, independently and partially, by a vapor-deposition method employing a shadow mask, so as to provide the red pixel, the green pixel, and the blue pixel. This method, however, has problems of low processing accuracy of the shadow mask, low alignment accuracy of the shadow mask, and an increase in the size of the shadow mask.

Particularly, in a field of a large display (such as a television), a larger size of a substrate has been demanded (e.g., from G6 to G8 or G10). According to the conventional method, it is necessary to prepare a mask having a size which is equal to or larger than the size of the substrate. For this reason, it is necessary to manufacture or process a mask in accordance with the size of such a large substrate. However, the mask should be made from a significantly thin metal film (generally, a film thickness in a range of 50 nm to 100 nm). Accordingly, it is difficult to manufacture a large mask. Further, the conventional method also has problems in manufacturing and processing a mask in accordance with a large substrate. Low processing accuracy and low alignment accuracy cause light-emitting layers to be mixed with each other (i.e., a mixture of colors). In order to prevent this problem, generally, it is necessary to cause an insulating layer provided between pixels to have a wide width. Accordingly, in a case where each of the pixels has a predetermined area, there is a reduction in area of a light-emitting section. This causes a reduction in aperture ratio of the pixels. Such a reduction in aperture ratio results in a reduction in luminance, an increase in power consumption, and a reduction in a lifetime of the display. Further, according to a conventional production method, an organic layer is formed in such a manner that (i) a vapor-deposition source is provided below a substrate, and (ii) an organic material is vapor-deposited on substrate in an upward direction. With the method, however, the larger the substrate (the mask) becomes, the greater a flexure of the mask becomes in a center of the substrate. The problem of the flexure also causes the mixture of colors. Further, there is a case where the substrate has a part where no organic layer is provided due to significant flexure of the mask. This causes a leakage of a current between electrodes, and such a leakage results in a defect of the display. In addition, according to the conventional method, when the mask is used a certain number of times, the mask is deteriorated. It is impossible to use the mask thus deteriorated. Accordingly, the larger the mask becomes, the higher a production cost of the display becomes. The increase in production cost is regarded as the biggest problem in the field of the organic EL display.

In view of the problems, there has been proposed a method of manufacturing a large display by combining a plurality of organic EL displays with each other. However, in a case where a plurality of panels are combined with each other, connected edges of the plurality of panels are viewable to a viewer. This reduces display quality of the display. In order to solve the problem, Patent Literature 1 proposes a technique of further sealing four panels from a backside of the four panels. Although an aperture ratio becomes low with this technique, the problem of the connected edges viewable to the viewer is solved. Further, Non-patent Literature 1 proposes a method of eliminating the problem of the connected edges viewable to the viewer by (i) causing two panels to overlap each other so that sealing sections of the two panels overlap each other, and (ii) attaching, to one of two substrates of the two panels, a transmissive plate which is adjusted in refraction index.

CITATION LIST

[Patent Literature]
[Patent Literature 1]
Japanese Patent Application Publication, Tokukai, No. 2004-111059 A (Publication Date: Apr. 8, 2004)
[Non-Patent Literature]
[Non-Patent Literature 1]
The 15th International Display Workshops (from Dec. 3, 2008, to Dec. 5, 2008)

SUMMARY OF INVENTION

Technical Problem

However, it is necessary to cause terminals for driving a display section to extend from at least two sides of the display, which sides are orthogonal to each other. Generally, it is necessary to press and attach FPCs (flexible printed circuits) to the sides so that the FPCs are connected to drive circuits. For this reason, it is impossible to realize a display having no connection area by connecting a side having an FPC and another side having another FPC to each other. In view of this, according to Patent Literature 1, one display is realized by combining four panels with each other in such a manner that sides which have no FPC are connected to each other as much as possible. Further, according to Non-patent Literature 1, one display is realized by combining two panels with each other. However, these documents do not describe how to drive a unit provided in a center of the display in a case where five panels or more are combined with each other. This is a biggest problem in a case where one display is realized by combining a plurality of units with each other. In fact, according to these documents, it is impossible to realize one display by combining five panels or more with each other. Accordingly, in order to realize a large display, it is necessary to cause each of the panels which will be combined with each other to be large. That is, the problems described above, related to manufacture of the display, have not been solved sufficiently.

Moreover, in a case of a large LCD or a large PDP, there are problems related to how to carry such a display into an ordinary house, how to carry the display to an installation position, and where the display is installed. The problems are also found with a conventional organic EL display. Particularly, in a case where a large display is installed in an ordinary house, the problems described above are significant.

Further, in recent years, in view of ecology, an organic EL having significantly high light-emitting efficiency has also attracted attention in a field of an illumination device.

Solution to Problem

The present invention is made in view of the problems. An object of the present invention is to provide: a light-emitting panel device constituted by a plurality of panels combined with each other, which light-emitting panel device (i) has no limitation in the number of the plurality of panels thus combined (connected), (ii) can solve a problem of generation of connected edges viewable to a viewer, (iii) can have a reduction in production cost by reducing an area of each of the plurality of panels to a desired size, even in a case where a large panel is manufactured; an image display device including the light-emitting panel device; an illumination device including the light-emitting panel device; a panel provided in the light-emitting panel device; and a method of manufacturing the panel.

In view of the various problems described above, the inventors of the present invention have focused on a structure of a base of a light-emitting panel device, and a position of a drive circuit. With this concept, the inventors of the present invention found, as a result of diligent study, that the object described above can be attained. The inventors of the present invention thus have reached the present invention.

That is, in order to attain the object, a light-emitting panel device of the present invention includes: a plurality of panels each having a rectangular light-emitting section in which a plurality of light-emitting elements are arranged on a surface of a base, each of the plurality of light-emitting elements (i) having a first electrode and a second electrode, and (ii) emitting light by being supplied with a current or a voltage, the base being curved or bent at one of two edge parts of the surface of the base so as to provide an adjacent surface which (I) projects on a back surface side opposite to the surface side and (II) is adjacent to the one of two edge parts of the surface, the two edge parts extending along a pair of long sides constituting the rectangular light-emitting section, respectively, the adjacent surface being provided with a group of terminals thereon, which extend from the first electrode of each of the plurality of light-emitting elements of the rectangular light-emitting section, adjacent ones of the plurality of panels being combined with each other in such a manner that (1) a rectangular light-emitting section of one of the plurality of panels and a rectangular light-emitting section of an adjacent one of the plurality of panels are arranged to face in an identical direction, and (2) one of edge parts of a surface of a base of the one of the plurality of panels and one of edge parts of a surface of a base of the adjacent one of the plurality of panels are coupled together so that the rectangular light-emitting section of the one of the plurality of panels and of the rectangular light-emitting section of the adjacent one of the plurality of panels are arranged with respect to each other.

With the arrangement, it is possible to (i) cause a terminal to extend, to the adjacent surface, from an electrode of each of the plurality of light-emitting elements (e.g., organic electroluminescence elements) arranged in a direction (longitudinal direction) of long sides of the rectangular light-emitting section, and (ii) cause the terminal to be connected to a drive circuit on the adjacent surface. With the arrangement in which the drive circuit is arranged as described above, it is possible that, in a case where the one of the plurality of panels and the adjacent one of the plurality of panels are combined with each other, the light-emitting sections of these panels are combined (coupled) with each other without any gap between the light-emitting sections. This is because, here, the adjacent surface (of the one of the plurality of panels), on which the drive circuit is arranged, projects on a back surface side of the base in the vicinity of a connection part (a border of the connection part) between the light-emitting sections of the one of the plurality of panels and the adjacent one of the plurality of panels.

As described above, according to the arrangement of the present invention, it is possible that (i) the adjacent surface is not viewable to a user at the connection part between the panels, and (ii) the one of the plurality of panels and the adjacent one of the plurality of panels are coupled together in such a manner that (I) longitudinal directions of the rectangular light-emitting sections of the one of the plurality of panels and the adjacent one of the plurality of panels are parallel to each other, and (II) the edge parts of the surfaces of the bases are coupled with each other. Accordingly, by coupling the panels together as described above, it is possible to couple the panels together with no limitation in the number of panels to be coupled together. It is therefore possible to realize a single large light-emitting section by combining the light-emitting sections of the panels with each other, without any gap between the light-emitting sections.

Further, in other words, according to the arrangement of the present invention, since the panels can be coupled together with no limitation in the number of panels to be coupled together, it is possible to reduce, to a desired size, an area of each of the panels to be combined. It is therefore possible to realize a panel which can have a reduction in production cost with such compact panels.

Furthermore, according to the arrangement of the present invention, the rectangular light-emitting section is provided. Accordingly, even in a case where an organic electroluminescence (EL) element is provided as the light-emitting element, it is possible that (i) a mask process is carried out easily, in which mask process a material is applied to only a desired part by a mask vapor-deposition method by use of a conventional shadow mask, (ii) high alignment accuracy of the shadow mask is obtained, and (iii) there is no influence of misalignment due to flexure of the mask.

Moreover, it is possible to have a reduction in a size of a device for producing a large panel. This reduces a production cost. Accordingly, by providing the light-emitting panel device of the present invention, it is possible to provide a large organic EL display, a large organic EL display device, and a large organic EL illumination device at low cost.

Further, as described above, according to the present invention, the panels are combined with each other along long sides of the light-emitting sections of the panels. Accordingly, as compared with a case where the panels are combined with each other along short sides of the light-emitting sections of the panels, it is possible to produce a large image display device with the panels the number of which is less than the above case (in a case where the panels have the same width (a length of a short side of each panel) as in the above case). Specifically, in a case of a 65-inch high-vision television, a size of a panel (a completed large panel) is 1400 mm (a long side of an end single panel)×800 mm (a short side of the end single panel). Here, each of the panels has a width of 100 mm, for example. In a case where an image display device (later described) of the present invention is constituted such that the panels are combined with each other along the long sides of the light-emitting sections of the panels, each of the panels has a size of 1400 mm×100 mm. In this case, the end single panel is completed with eight panels. On the other hand, in a case where the panels are combined with each other along the short sides of the light-emitting sections of the panels, each of the panels has a size of 800 mm×100 mm. In this case, the end single panel is completed with fourteen panels.

As a result, it is possible to realize a large light-emitting panel device with a small number of connection parts. By applying the light-emitting panel device to an image display device or an illumination device, it is possible to manufacture a large image display device or a large illumination device.

Further, the scope of the present invention encompasses the panel itself which is one of components of the light-emitting panel device described above.

That is, the scope of the present invention encompasses a panel which includes a rectangular light-emitting section in which a plurality of light-emitting elements are arranged on a surface of a base, each of the plurality of light-emitting elements (i) including a first electrode and a second electrode, and (ii) emitting light by being supplied with a current or a voltage, the base being curved or bent at one of two edge parts of the surface of the base so as to provide an adjacent surface which (I) projects on a back surface side opposite to the surface and (II) is adjacent to the one of two edge parts of the surface, the two edge parts extending along a pair of long sides constituting the rectangular light-emitting section, respectively, the adjacent surface being provided with a group of terminals thereon, which extend from the first electrode of the rectangular light-emitting section.

Furthermore, the scope of the present invention encompasses a method of manufacturing the panel provided in the light-emitting panel device.

That is, a method of the present invention, for manufacturing the panel includes the steps of: (a) preparing the base having the surface and the adjacent surface; and (b) providing, on the surface of the base prepared in the step (a), an organic electroluminescence element serving as a light-emitting element which (i) has a first electrode and a second electrode, and (ii) emits light by being supplied with a current or a voltage, the step (b) including the steps of: (c) providing the first electrode or the second electrode on the surface; and (d) providing, by use of an in-line vapor-deposition method, on the first electrode or the second electrode provided in said step (c), an organic layer so that the organic layer is provided between the first electrode and the second electrode in the organic electroluminescence element.

With the arrangement, the organic layer is formed by the in-line vapor-deposition method. Accordingly, it is possible to apply a material to only a desired part by the mask vapor-deposition method employing the shadow mask, while taking advantage of high productivity of the in-line vapor-deposition method as much as possible.

Specifically, in the method in which a material is applied to only a desired part by use of the shadow mask which can be used in manufacturing the organic EL, generally, a vapor-deposition source (source), the shadow mask, and a substrate are arranged in this order from a bottom. The shadow mask becomes larger as the substrate becomes larger. For this reason, according to a conventional technique, the shadow mask is attached to a rigid frame with a tension so as to reduce generation of flexure of the shadow mask. However, even with such an arrangement, there are problems due to the flexure of the mask, such as color shift, a mixture of colors, generation of a non-emissive pixel (non-emissive line), and a leakage of a current which causes an increase in power consumption. The problems are regarded as biggest problems in this field. Meanwhile, by use of the method of the present invention, it is possible to reduce a length of sides of each panel significantly, as compared with a completed large panel. The base is carried in a longitudinal direction of the panel by use of an in-line vapor-deposition device, so as to form a film. With such a production process, it is possible to have a significant reduction in a mask width. It is therefore possible to prevent the flexure of the shadow mask.

As a result, it becomes possible to solve the problems due to the flexure of the shadow mask, such as the color shift, the mixture of colors, the generation of a non-emissive pixel (non-emissive line), and the leakage of a current which causes an increase in power consumption. Accordingly, it is possible to manufacture efficiently a panel which can have a reduction in cost and a reduction in power consumption. It is therefore possible to realize a light-emitting panel device employing the panels at low cost with low power consumption.

In the same manner as the light-emitting panel device, it is also possible to achieve these effects in manufacturing an image display device including the light-emitting panel device, and an illumination device including the light-emitting panel device.

Advantageous Effects of Invention

As described above, a light-emitting panel device of the present invention includes: a plurality of panels each having a rectangular light-emitting section in which a plurality of light-emitting elements are arranged on a flat surface of a base, each of the plurality of light-emitting elements (i) having a first electrode and a second electrode, and (ii) emitting light by being supplied with a current or a voltage, the base being curved or bent at one of two edge parts of the flat surface of the base so as to provide an adjacent surface which (I) projects on a side opposite to a flat surface side and (II) is adjacent to the one of two edge parts of the flat surface, the two edge parts extending along a pair of long sides constituting the rectangular light-emitting section, respectively, the adjacent surface being provided with a group of terminals thereon, which extend from the first electrode of each of the plurality of light-emitting elements of the rectangular light-emitting section, adjacent ones of the plurality of panels being combined with each other in such a manner that (1) a rectangular light-emitting section of one of the plurality of panels and a rectangular light-emitting section of an adjacent one of the plurality of panels are arranged to face in an identical direction, and (2) one of edge parts of a flat surface of a base of the one of the plurality of panels and one of edge parts of a flat surface of a base of the adjacent one of the plurality of panels are coupled together so that a longitudinal direction of the rectangular light-emitting section of the one of the plurality of panels and a longitudinal direction of the rectangular light-emitting section of the adjacent one of the plurality of panels are parallel to each other.

With the arrangement, it is possible that (i) there is no limitation in the number of the plurality of panels thus combined (connected), (ii) a problem of connection parts between the plurality of panels are solved, and (iii) even in a case where a large panel is manufactured, a size of each of the plurality of panels can be reduced to a desired area so that a desired compact panel is obtained.

Further, an image display device of the present invention includes the light-emitting panel device. It is therefore possible to (i) cause the image display device to be larger than a conventional arrangement and (ii) provide the image display device at low cost. Furthermore, an illumination device of the present invention includes the light-emitting panel device. It is therefore possible to (i) cause the illumination device to be larger than a conventional arrangement and (ii) provide the illumination device at low cost.

DESCRIPTION OF EMBODIMENTS

One embodiment of the present invention is described below with reference to FIGS. 1 through 12. An image display device of the present embodiment can be used as a display device having a function of displaying an image (video), such as a television receiver.

In an arrangement of the image display device of the present embodiment, a characteristic arrangement of the present invention is a panel including a rectangular display section having a plurality of organic electroluminescence (EL) elements. The following description deals with the arrangement of the image display device of the present embodiment, particularly, details of an arrangement of the panel and a method of manufacturing the panel.

[1] Arrangement of Image Display Device

Figure 1:
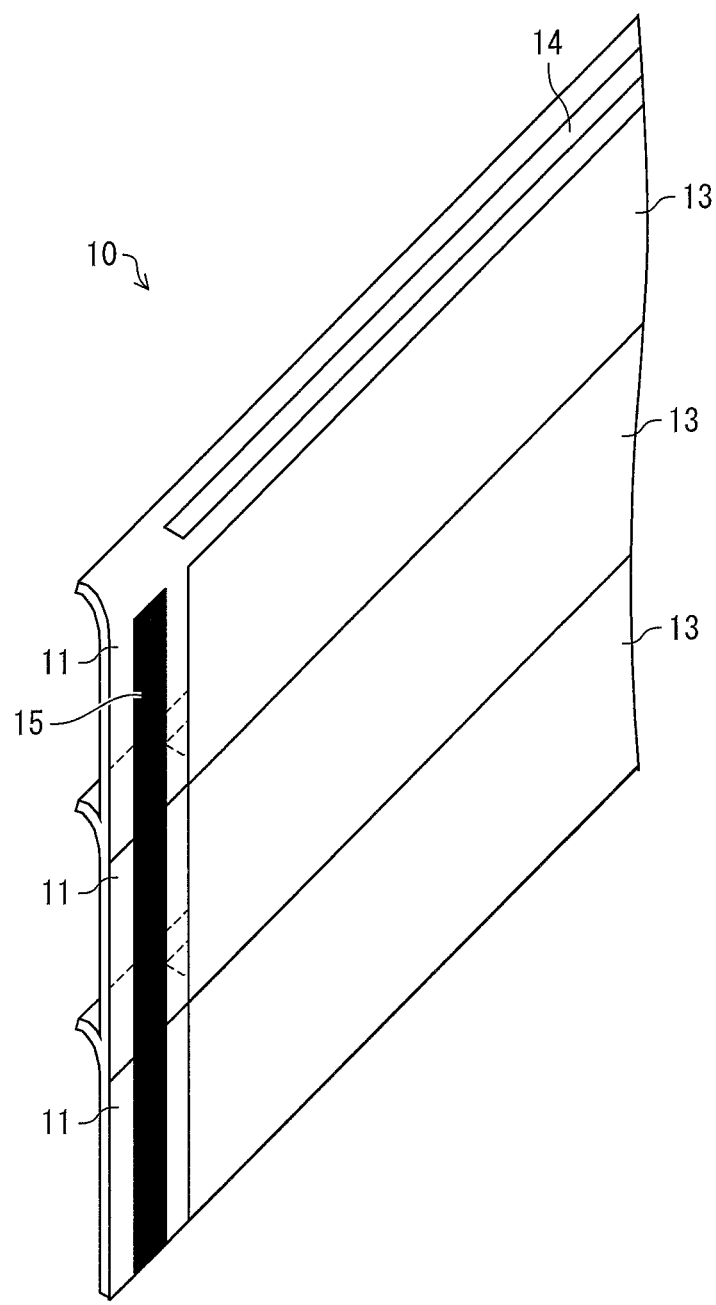
FIG. 1 is a perspective view illustrating an arrangement of an image display device in accordance with one embodiment of the present invention.

FIG. 1 is a perspective view illustrating the arrangement of the image display device of the present embodiment. The image display device includes an image display 10 and an external drive circuit (not illustrated) (see FIG. 1).

Figure 2:
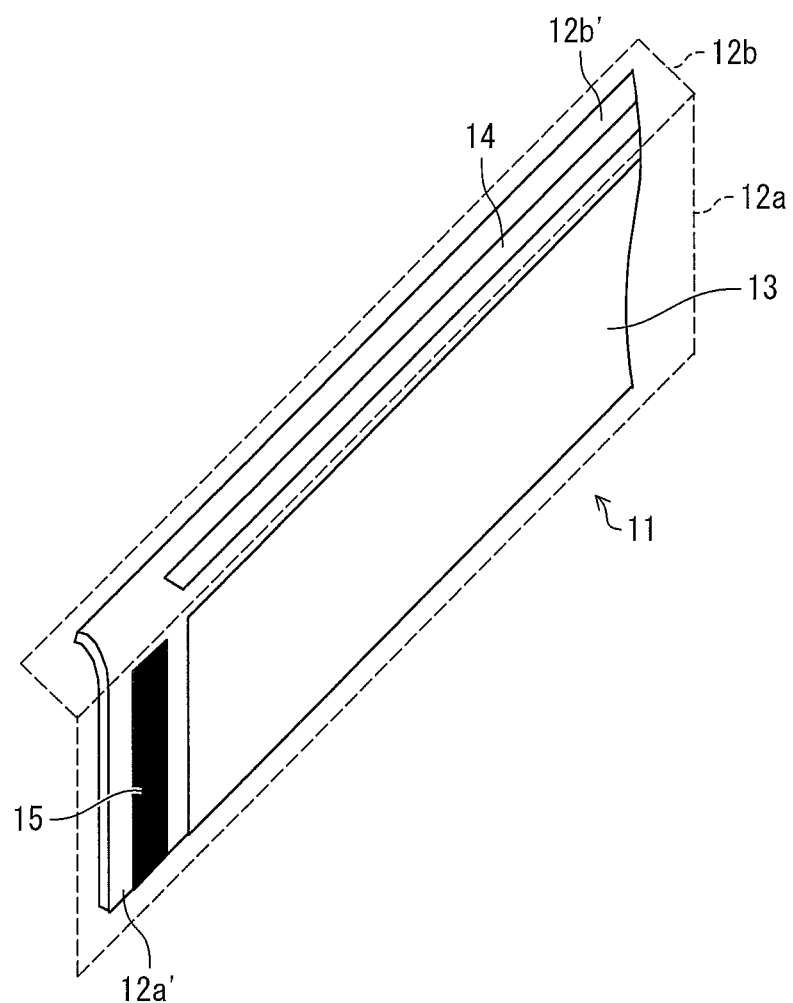
FIG. 2 is a perspective view illustrating a panel constituting an image display provided in the image display device illustrate in FIG. 1.

The image display 10 has such an arrangement that a plurality of panels 11 (three panels 11 in FIG. 1), each including a rectangular display section 13 illustrated in FIG. 2, are combined with each other (details of the image display 10 will be described later). The external power supply circuit is electrically connected to each of the plurality of panels 11 so as to drive each of the plurality of panels 11.

The external drive circuit is provided to drive the display section 13 provided in each of the plurality of panels 11 of the image display 10. The external drive circuit includes a scan line electrode circuit, a data signal electrode circuit, and a power supply circuit.

Here, it is possible to have such an arrangement that (i) all of the plurality of panels 11 are electrically connected to each other, and (ii) all of the plurality of panels 11 are driven simultaneously by the external drive circuit. Note, however, that the present invention is not limited to a driving mode described above. Alternatively, it is possible to have such an arrangement that (i) each of the plurality of panels 11 is electrically connected to an external drive circuit independently, and is driven by the external drive circuit independently. The following description deals with a case where the image display device of the present embodiment is subjected to simple matrix driving, for example. In a case where the image display 10 is manufactured by combining the plurality of panels 11 with each other, a terminal of an H scan 14, which is provided along one of long sides of the rectangular display section 13 of each of the plurality of panels 11, is connected directly and electrically (specifically, the terminal is connected to each of a plurality of FPCs directly and electrically). Then, the H scan 14 is connected to the power supply circuit via a conventional scanning electrode circuit externally provided. A group of terminals are arranged on a V scan 15 along one of short sides of the rectangular display section 13 of each of the plurality of panels 11. The V scan 15 is connected to another power supply circuit via a conventional data signal electrode circuit externally provided. With the arrangement, it is possible to carry out the simple matrix driving.

Alternatively, it is possible to carry out the driving in such a manner that (i) the H scan 14 of each of the plurality of panels 11 is independently connected to a power supply circuit via the conventional scanning electrode circuit externally provided, and (ii) the V scan 15 is connected to the power supply circuit via the conventional data signal electrode circuit externally provided.

Figure 3:
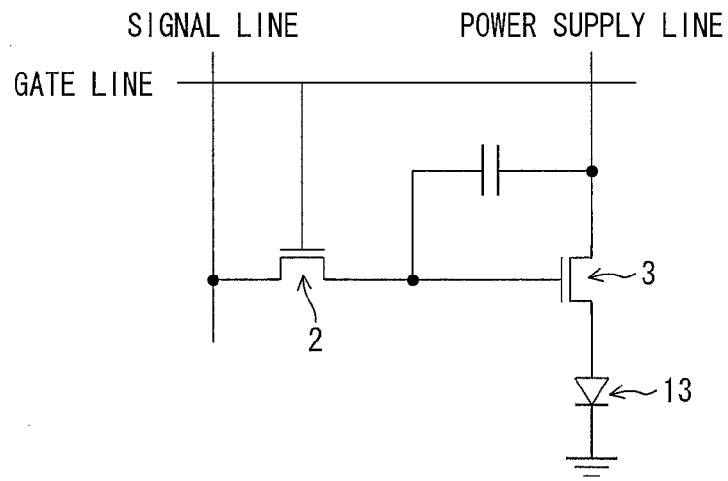
FIG. 3 is a view illustrating a drive circuit employing a voltage-driving digital-gray scale method which is an example of a method of driving the image display device of the present embodiment, illustrated in FIG. 1.

Further, the image display device of the present embodiment can have such an arrangement that the display section 13 is subjected to active matrix driving. In a case of an active matrix image display device, a switching circuit such as a TFT is provided in a pixel in each of the plurality of panels 11, and is electrically connected to an external drive circuit (a scan line electrode circuit (a gate driver), a data signal electrode circuit (a source driver), and a power supply circuit) for driving each of the rectangular organic EL displays. For example, as illustrated in FIG. 3, (i) the driving is carried out by the voltage-driving digital-gray scale method, (ii) two TFTs, namely, a switching TFT 2 and a driving TFT 3, are provided for each of a plurality of pixels, and (iii) the driving TFT 3 is electrically connected to a first electrode provided in the display section 13 via a contact hole formed on a flattening layer. Further, a capacitor for causing a gate potential of the driving TFT 3 to be a constant potential is provided in each of the plurality of pixels so as to be connected to a gate section of the driving TFT 3. On the TFT, the flattening layer is formed. Note, however, that the present invention is not limited to these, and either the voltage-driving digital-gray scale method or a current-driving analogue-gray scale method can be employed. Moreover, the number of TFTs is not particularly limited. The display section 13 can be driven by use of two TFTs as described above, or a conventional display section 13 (see FIGS. 1 and 2), in which a compensation circuit is provided in each of the plurality of pixels to prevent generation of differences in property (mobility, a threshold voltage) between TFTs, can be driven by use of two or more TFTs. The following description deals with a case where the active matrix driving is carried out, for example. In a case where the image display device is constituted by the plurality of panels 11 combined with each other (see FIGS. 1 and 2), the terminal of the H scan 14 (see FIGS. 1 and 2), provided in the vicinity of one of the long sides of each of the plurality of panels 11, is connected directly and electrically (specifically, the terminal of each H scan is connected to each of a plurality of FPCs directly and electrically). After that, the H scan 14 is connected to a conventional source driver externally provided. The V scan 15 (see FIGS. 1 and 2) is connected to a conventional gate driver externally provided. The image display device can be thus driven.

Note that it is also possible to carry out the driving in such a manner that (i) the H scan 14 is connected to the conventional gate driver externally provided and (ii) the V scan 15 is connected to the conventional source driver externally provided. Further, it is possible to have an arrangement in which the source driver and the gate driver are provided by the same process as a TFT process for constituting the plurality of pixels, so as to be built in the panel. Furthermore, it is possible to carry out the driving in such a manner that the H scan 14 of each of the plurality of panels 11 is independently connected to the conventional source driver externally provided, and the V scan 15 is connected to the conventional gate driver externally provided. Moreover, it is possible to have an arrangement in which the source deriver and the gate driver are provided by the same process as the TFT process for constituting each of the plurality of pixels, so as to be built in the panel.

Next, the following description deals with an arrangement of the panel 11 with reference to FIG. 3.

[2] Arrangement of Panel

The panel 11 includes a substrate 12, the display section 13, the H scan 14, and the V scan 15 (see FIG. 2). The following description deals with each of these components.

[Substrate]

The display section 13, the H scan 14, and the V scan 15 are provided on one of surfaces of the substrate 12 (see FIG. 2).

As described later, the display section 13 has a rectangular shape, and a region 12a of the substrate 12, where the display section 13 is formed, is provided as a flat surface 12a' which has a rectangular shape corresponding to the rectangular shape of the display section 13.

Here, the substrate 12 further has a region 12b (hereinafter, referred to as "adjacent region 12b") which is adjacent to the flat surface along one of long sides of the rectangular display section 13.

The adjacent region 12b is a characteristic arrangement of the present invention.

Specifically, the adjacent region 12b has an adjacent surface 12b' which constitutes a single surface in combination with the region 12a (flat surface 12a') of the substrate 12. The adjacent region 12b has a predetermined width in a direction vertical to a direction in which long sides of the flat surface extend. The display section 13 is not provided on the adjacent surface 12b'. Specific feature of the adjacent surface 12b' is such that the adjacent region 12b is not a part of the flat surface but is curved with respect to the surface of the substrate 12, on which the display section 13 is formed, and therefore projects on a side opposite to the flat surface side.

Examples of the substrate 12 encompass: an inorganic material substrate made from glass, quartz, or the like; a plastic substrate made from polyethylene terephthalate, polycarbazole, polyimide, or the like; an insulating substrate such as a ceramics substrate made from alumina or the like; a metal substrate made from aluminum (Al), Iron (Fe) or the like; a substrate obtained by coating the metal substrate with an insulating material made from oxide silicon ($SiO_2$) or an organic insulating material; and a substrate obtained by causing a surface of a metal substrate made from Al or the like to be subjected to an insulating process by, for example, anodic oxidation. Although the present invention is not limited to these materials, it is preferable to use the plastic substrate or the metal substrate, with which it is possible to form the curved adjacent region without any stress. Further, it is more preferable to use a plastic substrate coated with an inorganic material or a metal substrate coated with an inorganic insulating material. With such a substrate, it becomes possible to prevent deterioration of the display section 13 due to water transmitted through the substrate 12, which is the biggest problem in a case where the plastic substrate is used as the substrate 12 of the panel 11. Furthermore, it becomes also possible to prevent a leakage (short-circuit) of a current due to a projection of a metal substrate, which is the biggest problem in a case where the metal substrate is used as the organic EL substrate (there has been known that, since the organic EL film has a significantly small thickness in a range of 100 nm to 200 nm, a leakage (short-circuit) of a current is frequently caused in a pixel due to such a projection).

Moreover, in a case where a transparent or translucent substrate is used as the substrate 12, it is possible to take light out of the display section 13 from a back surface side of the substrate 12 (from a far side in FIG. 1).

Further, how to form the curved adjacent region 12b (adjacent surface 12b) is not particularly limited. The adjacent region 12b can be formed by, for example, processing a flat substrate so as to curve the flat surface, or by molding a substrate 12 having such a curved region. In a case where the curved region is formed by processing the substrate, the processing can be carried out before the display section 13 is formed. Alternatively, the curved region can be formed in such a manner that when the display section 13 is formed, the substrate has still a flat shape, and then, after the display section 13 is formed, a part to be the adjacent region 12b is processed to be curved.

According to the present embodiment, the substrate 12 is such that the region 12a on which the display section 13 and the adjacent region 12b are provided as being one substrate. Note, however, that the present invention is not limited to this, and the substrate 12 may have such an arrangement that a structure (e.g., a flat plate) having the region 12a on which the display section 13 is provided, and another structure (e.g., a plate curved in a U-shape) having the adjacent region 12b are attached to each other so as to constitute one substrate 12. Here, these structures can be made from either the same material or different materials.

[Another Example of Substrate: Active Matrix Substrate]

The image display device of the present embodiment can cause the display section 13 to be subjected to the active matrix driving, as described above. In order to carry out the active matrix driving, it is necessary to use an active matrix substrate as the substrate 12. The active matrix substrate is such that a plurality of scan signal lines, a plurality of data signal lines, and a plurality of TFTs which are provided, respectively, at intersections between the plurality of scan signal lines and the plurality of data signal lines, are provided on a glass substrate, preferably a metal substrate or a plastic substrate, more preferably a metal substrate coated with an insulating material or a plastic substrate coated with an insulating material.

In a case where a TFT is formed, it is preferable that the TFT is made from a material which cannot be molten or warped at a temperature of not more than 500° C. Further, it is difficult to form the TFT on a metal substrate by use of a conventional production device since a general metal substrate has a thermal expansibility different from that of glass. However, in a case where a metal substrate is made from an iron-nickel alloy having a linear coefficient of expansion of not more than $11 \times 10^{-5}/°$ C., the metal substrate has a thermal expansibility identical with that of glass. In this case, it becomes possible to form the TFT on the metal substrate by use of the conventional production device at low cost. Furthermore, in the case of the plastic substrate, there is a problem that an upper temperature limit of the plastic substrate is significantly low. However, the TFT can be provided on the plastic substrate in such a manner that (i) the TFT is formed on a glass substrate, and then (ii) the TFT is transferred to the plastic substrate.

In the above descriptions, the plurality of scan signal lines, the plurality of data signal lines, and the plurality of TFTs provided at the respective intersections between the plurality of scan signal lines and the plurality of data signal lines, are explained as components of the substrate 12. Note, however, that the present invention is not limited to this. These members can be provided as components of the display section 13 which is described later.

Further, not only the TFT but also an interlayer insulating film and a flattening film are provided on the active matrix substrate.

Here, the following description deals with details of the TFT, the interlayer insulating film, and the flattening film.

TFT

The TFT is formed on the substrate 12 in advance before the display section 13 is formed, and serves as a switching and driving TFT. According to the present invention, the TFT may be a known TFT. Further, it is possible to use a metal-insulator-metal (MIM) diode in place of the TFT.

The TFT used in the present invention can be formed by use of a known material, a known structure, and a known production method. Examples of a material of an active layer of the TFT encompass: an inorganic semiconductor material such as amorphous silicon, polycrystalline silicon (polysilicon), microcrystalline silicon, and cadmium selenide; an oxide semiconductor material such as zinc oxide and indium oxide-gallium oxide-zinc oxide; and an organic semiconductor material such as a polythiophene derivative, a thiophene oligomer, a poly (p-phenylenevinylene) derivative, naphthacene, and pentacene. Furthermore, examples of the structure of the TFT encompass a staggered type, an inverted staggered type, a top-gate type, and a coplanar type.

Examples of a method of forming the active layer of the TFT encompass (i) a method in which an amorphous silicon film formed by a plasma enhanced chemical vapor-deposition (PECVD) method is subjected to ion doping, (ii) a method in which an amorphous silicon film is formed by a low pressure chemical vapor-deposition method employing a silane ($SiH_4$) gas, and then, polysilicon is obtained by crystallizing the amorphous silicon film by a solid phase growth method, after that, the polysilicon is subjected to the ion doping by an ion implantation method, (3) an amorphous silicon film is formed by the LPCVD method employing an $Si_2H_6$ gas or the PECVD method employing $SiH_4$ gas, and then, the amorphous film is crystallized by being annealed by use of a laser such as an excimer laser, so as to obtain polysilicon, after that, the polysilicon thus obtained is subjected to the ion doping (a low-temperature process), (4) a polysilicon layer is formed by the LPCVD method or the PECVD method, and then, the polysilicon flayer thus formed is subjected to thermal oxidation at a temperature of not less than 1000° C., so as to form a gate insulating film, after that, a gate electrode made from an $n^+$ polysilicon is formed on the gate insulating film, and ultimately, these are subjected to the ion doping (a high-temperature process), (5) a method in which an organic semiconductor material is formed by an ink-jet method or the like, and (6) a method in which a single crystal film of an organic semiconductor material is obtained.

The gate insulating film of the TFT used in the present invention can be formed by use of a known material. For example, the gate insulting film can be made from $SiO_2$ formed by the PECVD method or the LPCVD method, or $SiO_2$ which is obtained by causing a polysilicon film to be subjected to thermal oxidation. Further, as to the TFT used in the present invention, a signal electrode line, a scan electrode line, a common electrode line, a first drive electrode and a second drive electrode can be formed by use of known materials. For example, examples of such known materials encompass tantalum (Ta), aluminum (Al), and copper (Cu). The TFT of an organic EL panel of the present invention can be formed as described above. Note, however, that the present invention is not limited to these materials, structures, and methods.

Interlayer Insulating Film

The interlayer insulating film can be formed by use of a known material. Examples of a material of the interlayer insulating film encompass: an inorganic material such as silicon oxide ($SiO_2$), silicon nitride (SiN or $Si_3N_4$), and tantalum oxide (TaO or $Ta_2O_5$); and an organic material such as an acrylate resin and a resist material. Further, a method of forming the interlayer insulating film may be a dry process such as a chemical vapor-deposition (CVD) method and a vacuum deposition method, or a wet process such as a spin coat method. Furthermore, it is possible to carry out patterning by a photolithography method or the like, if necessary.

Moreover, in a case where light emitted from the display section 13 is taken out from a front side of the panel 11 (a near side in FIG. 1), it is preferable to use a light-blocking insulating film having a light-blocking effect in order to prevent a change in TFT property due to external light incident on the TFT provided on the substrate.

Further, it is also possible to use the insulating film and the light-blocking insulating film in combination with each other. Examples of a material of the light-blocking insulating film encompass an inorganic insulating material such as a material in which a pigment or a dye (such as phthalocyanine and quinacridone), is dispersed in a polymer resin (such as polyimide), a color resist, a black matrix material, and $Ni_xZn_yFe_2O_4$. Note, however, that the present invention is not limited to these materials and methods.

Flattening Film

In a case where the TFT and the like are formed on the substrate, a surface of the substrate has projections and recessions due to formation of the TFT and the like. This might cause the display section 13 to have a defect (for example, a defect of a pixel electrode, a defect of an organic layer provided on the display section 13, breakage of a counter electrode, a short-circuit between the pixel electrode and the counter electrode, and a reduction in pressure resistance). In order to prevent generation of such a defect, a flattening film can be provided on the interlayer insulating film.

The flattening film can be made from a known material. Examples of the material of the flattening film encompass an inorganic material such as silicon oxide, silicon nitride, and tantalum oxide, and an organic material such as polyimide, an acrylic resin, and a resist material. A method of forming the flattening film may be a dry process such as the CVD method and the vacuum deposition method, or a wet process such as the spin coat method. Note, however, that the present invention is not limited to these materials and methods.

Further, the flattening film has either a single layer arrangement or a multilayer arrangement.

[Display Section]

Figure 4:
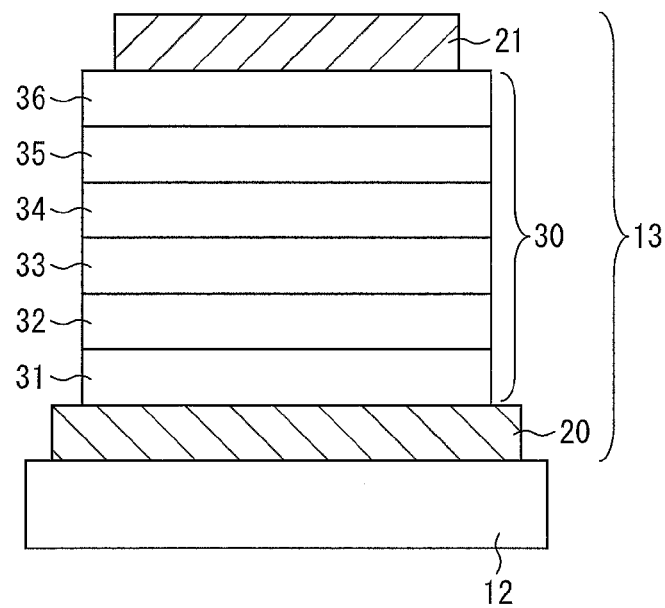
FIG. 4 is a cross-sectional view illustrating an arrangement of a display section formed on a panel of the image display provided in the image display device illustrated in FIG. 1.

The following description deals with a specific arrangement of the display section 13 illustrated in FIGS. 1 and 2, with reference to FIG. 4. FIG. 4 is a cross-sectional view illustrating the arrangement of the display section 13.

The display section 13 includes a plurality of organic EL elements (light-emitting elements), in each of which a first electrode 20, an organic layer 30 having an organic light-emitting layer made from at least an organic light-emitting material, and a second electrode 21 are provided in this order on the flat surface 12a' of the substrate 12. The display section 13 has a rectangular shape. The display section 13 is provided with the adjacent region 12b (adjacent surface 12b') which is adjacent to the flat surface 12a' in the vicinity of one of long sides of the rectangular display section 13 and along the one of long sides. Further, one of edge parts of the display section 13, which is in the vicinity of the other one of long sides, matches one of ends of the flat surface 12a', which is opposite to an adjacent surface 12b' provided to the flat surface 12a'. With the arrangement in which the one of ends of the display section 13 and the one of ends of the flat surface 12a' match each other, it is possible to constitute a single flat surface with the plurality of display sections 13 by combining the plurality of panels 11 with each other.

The display section 13 has an arrangement in which a plurality of organic EL elements, each having a red organic light-emitting layer, a green organic light-emitting layer, and a blue organic light-emitting layer, are arranged. With the arrangement, the display section 13 can display a full color image. Further, white light can be obtained by use of (i) an organic EL element in which a yellow organic light-emitting layer and a blue organic light-emitting layer are stacked or (ii) another organic EL element in which a red organic light-emitting layer, a green organic light-emitting layer, and a blue organic light-emitting layer are stacked.

Note that, although not illustrated in FIG. 4, it is possible to provide other members on the display section 13 in addition to the first electrode 20, the organic layer 30, and the second electrode 21. For example, it is possible that (i) an insulating edge cover for preventing a leakage at an edge part of the first electrode 20, and an insulating partition layer for retaining a functional material solution applied in a wet process for forming the organic layer 30, are formed in this order on the first electrode 20, and then (ii) the organic layer 30 and the second electrode 21 are provided on these in this order.

Organic Layer

The organic layer 30 illustrated in FIG. 4 can be either only an organic light-emitting layer (single layer arrangement) or a combination (multilayer arrangement) of the organic light-emitting layer and a charge transport layer. Specifically, examples of the arrangement of the organic layer encompass the following arrangements 1) through 9).

1) Organic light-emitting layer
2) Hole-transport layer/organic light-emitting layer
3) Organic light-emitting layer/electron-transport layer
4) Hole-transport layer/organic light-emitting layer/electron-transport layer
5) Hole-injection layer/hole-transport layer/organic light-emitting layer/electron-transport layer
6) Hole-injection layer/hole-transport layer/organic light-emitting layer/electron-transport layer/electron-injection layer
7) Hole-injection layer/hole-transport layer/organic light-emitting layer/hole-blocking layer/electron-transport layer
8) Hole-injection layer/hole-transport layer/organic light-emitting layer/hole-blocking layer/electron-transport layer/electron-injection layer
9) Hole-injection layer/hole-transport layer/electron-blocking layer/organic light-emitting layer/hole-blocking layer/electron-transport layer/electron-injection layer Note, however, that the present invention is not limited to these. Further, each of the aforementioned layers, namely, the organic light-emitting layer, the hole-injection layer, the hole-transport layer, the hole-blocking layer, the electron-blocking layer, the electron-transport layer, and the electron-injection layer, can have either a single layer arrangement or a multilayer arrangement.

Here, in FIG. 4, the aforementioned arrangement 8) is employed. That is, a hole-injection layer 31, a hole-transport layer 32, an organic light-emitting layer 33, a hole-blocking layer 34, an electron-transport layer 35, and an electron-injection layer 36 are provided in this order from the first electrode 20 to the second electrode 21.

The organic light-emitting layer 33 can be constituted by only an organic light-emitting material exemplified below, or by a combination of a light-emitting dopant and a host material. Further, the organic light-emitting layer 33 can include a hole-transport material, an electron-transport material, an additive (a donor, an acceptor, or the like), and/or the like, if necessary, and can have such an arrangement that such a material(s) is dispersed in a polymer material (a binding resin) or in an inorganic material. In view of light-emitting efficiency and a lifetime, it is preferable to use such a material that a light-emitting dopant is dispersed in a host material.

As the organic light-emitting material, a known light-emitting material for the organic EL can be used. Examples of such a light-emitting material encompass a low-molecular light-emitting material, and a polymer material. Specific examples of these materials are exemplified below. Note, however, that the present invention is not limited to these. Further, the light-emitting material may be a fluorescent material, a phosphorescent material, or the like. In view of low power consumption, it is preferable to use the phosphorescent material which has high light-emitting efficiency.

Here, specific compounds are described below. Note, however that the present invention is not limited to these materials.

Examples of the low-molecular organic light-emitting material encompass an aromatic dimethylidene compound (such as 4,4'-bis (2,2'-diphenylvinyl)-biphenyl (DPVBi)), an oxaziazol compound (such as 5-methyl-2-[2-[4-(5-methyl-2-benzoxazolyl)phenyl]vinyl]benzoxazole), a triazole derivative (such as 3-(4-biphenylyl)-4-phenyl-5-t-butylphenyl-1,2,4-triazol (TAZ)), a styrylbenzene compound (such as 1,4-bis (2-methylstyryl)benzene), a fluorescent organic material (such as a thiopyridine dioxide derivative, a benzoquinone derivative, a naphthoquinone derivative, an antraquinone derivative, a diphenoquinone derivative, and a fluorenone derivative), and a fluorescent light-emitting organic metal complex (such as an azomethine zinc complex and (8-hydroxyquinolinato)aluminum complex ($Alq_3$)).

Examples of a material of the polymer light-emitting material encompass a polyphenylenevinylene derivative (such as poly (2-decyloxy-1,4-phenylene) (DO-PPP), poly[2,5-bis-[2-(N,N,N-triethylammonium) ethoxy]-1,4-phenyl-alt-1,4-phenylene]dibromide (PPP-NEt3+), poly[2-(2'-ethylhexyloxy)-5-methoxy-1,4-phenylenevinylene] (MEH-PPV), poly[5-methoxy-(2-propanoxysulfonide)-1,4-phenylenevinylene](MPS-PPV), and poly[2,5-bis-(hexyloxy)-1,4-phenylene-(1-cyanovinylene)] (CN-PPV)), and a polyspiro derivative (such as poly (9,9-dioctyl fluorene) (PDAF)).

As the light-emitting dopant which is contained in the organic light-emitting layer 33, if necessary, a known dopant material for the organic EL can be used. Examples of such a dopant material encompass a fluorescent light-emitting material (such as a styryl derivative, perylene, an iridium complex, a coumarin derivative, Lumogen F Red, dicyanomethylene pyran, phenoxazine, and a porphyrin derivative), and a phosphorescent light-emitting organic metal complex (such as bis[(4,6-difluorophenyl)-pyridinato-N,C2']picolinate iridium (III) (FIrpic), tris(2-phenyl pyridyl) iridium (III) (Ir (ppy)$_3$), and tris(1-phenylisoquinoline) iridium (III) (Ir (piq)$_3$)).

Further, as the host material used with the dopant, a known host material for the organic EL can be used. Examples of such a host material encompass the aforementioned low-molecular light-emitting material, the aforementioned polymer light-emitting material, and a carbazole derivative (such as 4,4'-bis(carbazole) biphenyl, 9,9-di(4-dicarbazole-benzyl) fluorene (CPF)).

Furthermore, in order to carry out the injection of an electric charge (hole, electron) from an electrode and transport (injection) of the electric charge into the organic light-emitting layer, the charge-injection/transport layer can be used. Examples of the charge-injection/transport layer encompass a charge injection layer (hole-injection layer 31, electron-injection layer 36) and a charge transport layer (hole-transport layer 32, electron-transport layer 35). The charge-injection/transport layer can be constituted by only a charge injection/transport material exemplified below, or can additionally contain an additive (such as a donor and an acceptor) or the like, if necessary. The charge-injection/transport layer can have an arrangement in which such a material(s) is dispersed in a polymer material (binding resin) or in an inorganic material.

As the charge-injection/transport material, a known material for the organic EL or a known material for an organic photo conductor can be used. Examples of the charge-injection/transport material encompass a hole-injection/transport material and an electron-injection/transport material. Specific examples of these are described below. Note, however, that the present invention is not limited to these materials.

Examples of the hole-injection/transport material encompass a low-molecular material (such as an oxide (such as vanadium oxide ($V_2O_5$) and molybdenum oxide ($MoO_2$)), an inorganic p-type semiconductor material, a porphyrin compound, an aromatic tertiary amine compound (such as N,N'-bis(3-methylphenyl)-N,N'-bis (phenyl)-benzidine (TPD) and N,N'-di (naphthalene-1-yl)-N,N'-diphenyl-benzidine (NPD)), a hydrazone compound, a quinacridone compound, and a styrilamine compound), and a polymer material (such as polyaniline (PANI), polyaniline-camphor sulfonic acid (PANI—CSA), 3,4-polyethylene dioxy thiophene/polystylene sulfonate (PEDOT/PSS), a poly (triphenyl amine) derivative (Poly-TPD), and polyvinyl carbazole (PVCz), poly (p-phenylenevinylene) (PPV), and poly (p-naphthalenevinylene (PNV)).

Further, in view of efficiency in carrying out the injection/transport of the hole from an anode, it is preferable that the hole-injection layer is made from a material which is lower than the hole injection/transport material of the hole-transport layer in energy level of a highest occupied molecular orbital (HOMO), and (ii) the hole-transport layer is made from a material which is higher than the hole-injection/transport material of the hole-injection layer in mobility of the hole.

Furthermore, in order to improve a property of the injection/transport of the hole, it is preferable that the hole-injection/transport material is doped with an acceptor. As the acceptor, a known acceptor material for the organic EL can be used. Specific examples of such an acceptor material are described below. Note, however, that the present invention is not limited to these materials.

Examples of the acceptor material encompass an inorganic material (such as Au, Pt, W, Ir, $POCl_3$, $AsF_6$, Cl, Br, I, vanadium oxide ($V_2O_5$), and molybdenum oxide ($MoO_2$)), and an organic material (such as a compound having a cyano group (such as TCNQ (7,7,8,8,-tetracyanoquinodimethane), $TCNQF_4$ (tetrafluorotetracyanoquinodimethane), TCNE (tetracyanoethylene), HCNB (hexacyanobutadiene), and DDQ (dicyclodicyanobenzoquinone)), a compound having a nitro group (such as TNF (trinitrofluorenone) and DNF (dinitrofluorenone)), fluoranil, chloranil, and bromanil). Among these, the compound having a cyano group (such as TCNQ, $TCNQF_4$, TCNE, HCNB, and DDQ) can effectively increase a carrier concentration, and it is therefore preferable to employ, as the acceptor material, the compound having a cyano group.

Examples of the electron-injection/transport material encompass an inorganic material which is an n-type semiconductor, a low-molecular material (such as an oxadiazole derivative, a triazole derivative, a thiopyrazinedioxido derivative, a benzoquinone derivative, a naphthoquinone derivative, an antraquinone derivative, a diphenoquinone derivative, a fluorenone derivative, and a benzodifuran derivative), and a polymer material (such as poly (oxadiazole) (Poly-OXZ), and a polystyrene derivative (PSS)). Particularly, the electron-injection material may be a fluoride (such as lithium fluoride (LiF) and barium fluoride ($BaF_2$)) or an oxide (such as lithium oxide ($Li_2O$)), for example.

In view of efficiency in carrying out the injection/transport of the electron from a cathode, it is preferable to (i) employ, as a material of the electron-injection layer 36, a material which is higher than the electron-injection/transport material of the electron-transport layer 35 in energy level of a lowest unoccupied molecular orbital (LUMO), and (ii) employ, as a material of the electron-transport layer 35, a material which is higher than the electron-injection/transport material of the electron-injection layer 36 in mobility of the electron.

Further, in order to improve a property of the injection/transport of the electron, it is preferable that the electron-injection/transport material is doped with a donor. As the donor, a known donor material for the organic EL can be used. Specific examples of the donor material are described below. Note, however, that the present invention is not limited to these materials.

Examples of such a donor material encompass an inorganic material (such as an alkali metal, an alkali earth metal, a rare-earth element, Al, Ag, Cu, and In), and an organic material (such as a compound having an aromatic tertiary amine as its skeleton (such as aniline series, phenylenediamine series, benzidine series (such as N,N,N',N'-tetraphenylbenzidine, N,N'-bis-(3-methylphenyl)-N,N'-bis-(phenyl)-benzidine, and N,N'-di (naphthalene-1-yl)-N,N'-diphenyl-benzidine), triphenylamine series (such as triphenylamine, 4,4'4"-tris (N,N-diphenyl-amino)-triphenylamine, 4,4'4"-tris (N-3-methylphenyl-N-phenyl-amino)-triphenylamine, and 4,4'4"-tris (N-(1-naphthyl)-N-phenyl-amino)-triphenylamine), triphenyldiamine series (such as N,N'-di-(4-methyl-phenyl)-N,N'-diphenyl-1,4-phenylenediamine)), a polycyclic compound (note that the polycyclic compound here can have a substituent group) (such as phenanthrene, pyrene, perylene, anthracene, tetracene, and pentacene), TTF (tetrathiafulvalene) series, dibenzofuran, phenothiadine, and carbazole). Among these, the compound having an aromatic tertiary amine as its skeleton, the polycyclic compound, and the alkali metal can effectively increase a carrier concentration, and it is therefore preferable to employ one of these materials as the donor material.

The organic layer 30, constituted by the hole-injection layer 31, the hole-transport layer 32, the organic light-emitting layer 33, the hole-blocking layer 34, the electron-transport layer 35, and the electron-injection layer 36, can be formed by use of solutions for forming an organic layer, in each of which a corresponding one of the aforementioned materials is dissolved and dispersed in a solvent. The organic layer 30 can be formed by any one of the following methods: a coating method (such as the spin coat method, a dipping method, a doctor blade method, a discharge coat method, and a spray coat method), a known wet process (such as an ink-jet method, a relievo printing method, an intaglio printing method, a screen printing method, and a micro gravure coat method), a dry process (such as a resistance heating vapor-deposition method, an electron-beam (EB) vapor-deposition method, a molecular beam epitaxy (MBE) method, a sputtering method, and an organic vapor-phase deposition (OVPD) method), and a laser transfer method. In a case where the organic layer 30 is formed by the wet process, the solution for forming the organic layer 30 may contain an additive (such as a leveling agent and a viscosity adjusting agent) for adjusting a physicality of the solution.

Figure 5:
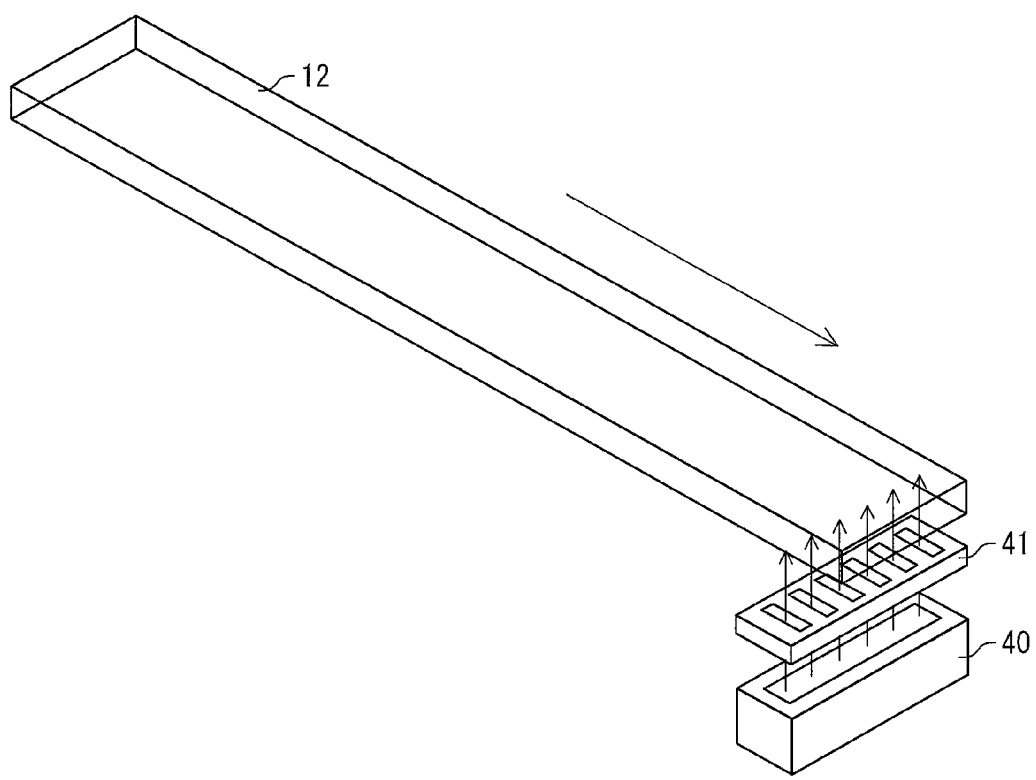
FIG. 5 is a view illustrating how to form the panel of the image display provided in the image display device illustrated in FIG. 1.

In Example 1 which will be described later, the organic layer 30 is formed by an in-line method and the resistance heating vapor-deposition method which is one of examples of the dry process. FIG. 5 is an explanatory view illustrating a method of forming the organic layer 30 by use of an in-line resistance heating vapor-deposition device. As illustrated in FIG. 5, a solution is applied to the substrate 12 on which the first electrode 20 is formed, which solution is applied from a vapor-deposition source 40 in which the solution for forming the organic layer is stored. In this case, in order to apply the solution to only a desired area, a shadow mask 41 is provided between the substrate 12 and the vapor-deposition source 40, so as to cover a part of the substrate 12, to which part the solution should not be applied. Then, the solution is applied. While the solution is being applied, a substrate holder (not illustrated) causes the substrate 12 to move in a direction indicated by an arrow in FIG. 5. This movement makes it possible to form the organic layer 30 on the rectangular first electrode 20 which has been formed on the flat surface 12a' of the substrate 12. The organic layer 30 has a rectangular shape whose size is identical with the first electrode 20. In the process illustrated in FIG. 5, the substrate 12 (substrate holder) is moved. Note, however, that the present invention is not limited to this. It is possible to have such an arrangement that the substrate 12 is not moved, and the vapor-deposition source 40 and the shadow mask 41 are moved above the substrate 12.

Generally, the organic layer 30 has a film thickness in a range of 1 nm to 1000 nm. It is preferable that the organic layer 30 has a film thickness in a range of 10 nm to 200 nm. In a case where the organic layer 30 has a film thickness of less than 10 nm, it is difficult to realize an originally-desired physicality (an electron injection characteristic, an electron transport characteristic, and an electron confinement property). Further, there is a risk that a pixel might have a defect due to a foreign substance such as dust. On the other hand, in a case where the organic layer 30 has a film thickness of more than 200 nm, there is an increase in driving voltage due to a resistance component of the organic layer 30. The increase in driving voltage leads to an increase in power consumption.

First Electrode and Second Electrode

The first electrode 20 and the second electrode 21, illustrated in FIG. 4, serve as a pair of electrodes, namely, an anode and a cathode of the organic EL element. That is, in a case where the first electrode 20 serves as the anode, the second electrode 21 serves as the cathode. In a case where the first electrode 20 serves as the cathode, the second electrode 21 serves as the anode. The following description deals with specific compounds used as the first electrode 20 and the second electrode 21, and specific methods for forming the first electrode 20 and the second electrode 21. Note, however, that the present invention is not limited to these materials and methods.

As an electrode material of the first electrode 20 and the second electrode 21, a known material can be used. In view of efficiency in carrying out the injection of the hole into the organic light-emitting layer 33, examples of a material of the anode (transparent electrode) encompass a metal having a work function of not less than 4.5 eV (such as gold (Au), platinum (Pt), and nickel (Ni)), an oxide (ITO) which has a work function of not less than 4.5 eV and is made of indium (In) and tin (Sn), an oxide ($SnO_2$) of tin (Sn), which has a work function of not less than 4.5 eV, and an oxide (IZO) which has a work function of not less than 4.5 eV and is made of indium (In) and zinc (Zn). Further, in view of efficiency in carrying out the injection of the electron into the organic light-emitting layer 33, examples of an electrode material of the cathode encompass a metal having a work function of not more than 4.5 eV (such as lithium (Li), calcium (Ca), cerium (Ce), barium (Ba), and aluminum (Al)), an Mg:Ag alloy which has a work function of not less than 4.5 eV and contains at least one of the metals, and an Li: Al alloy which has a work function of not less than 4.5 eV and contains at least one of the metals.

The first electrode 20 and the second electrode 21 can be formed, by use of the at least one of the materials described above, by a known method such as a sputtering method, an ion plating method, and a resistance heating vapor-deposition method. Note, however, that the present invention is not limited to these methods. Further, it is possible to develop, if necessary, a pattern of the electrode thus formed by use of a photolithography method and a laser abrasion method. It is also possible to form directly, by combination of the pattern and the shadow mask, the electrode whose pattern has been developed. It is preferable that each of the electrodes has a film thickness of not less than 50 nm. In a case where the film thickness of the first electrode 20 or the second electrode 21 is less than 50 nm, a wiring resistance becomes high. In this case, there is a risk that the driving voltage might be increased.

In order to take out the light emitted from the organic light-emitting layer 33 from the front side of the display section 13 (see FIGS. 1 and 2) (the near side in FIG. 1), it is preferable that the second electrode 21 is a transparent or translucent electrode. Further, in order to take out the light emitted from the organic light-emitting layer 33 from the backside of the panel 11 (the far side in FIG. 1), it is preferable that the first electrode 20 is a transparent or translucent electrode.

In the case of the transparent electrode, it is particularly preferable that the transparent electrode is made from ITO or IZO. It is preferable that the transparent electrode has a film thickness in a range of 50 nm to 500 nm, more preferably in a range of 100 nm to 300 nm. In a case where the transparent electrode has a film thickness of less than 50 nm, the wiring resistance becomes high. In this case, there is a risk that the driving voltage might be increased. On the other hand, in a case where the transparent electrode has a film thickness of more than 500 nm, there is a reduction in light transmittance. In this case, there is a risk that a luminance might be reduced.

Furthermore, in a case where (i) a microcavity (interference) effect is employed for the purpose of an improvement in color purity, an improvement in light-emitting efficiency, etc., and (ii) the light emitted from the organic light-emitting layer is taken out from a first electrode 20 (second electrode 21) side, it is preferable to use a translucent electrode as the first electrode 20 (second electrode 21). It is possible that the translucent electrode is made of either only a metal translucent electrode, or a combination of a metal translucent electrode and a transparent electrode material. However, in view of reflectivity and transmittance, it is preferable that the translucent electrode is made from silver. It is preferable that the translucent electrode has a film thickness in a range of 5 nm to 30 nm. In a case where the translucent electrode has a film thickness of less than 5 nm, reflection of the light is not sufficiently carried out. In this case, it is impossible to obtain the interference effect. On the other hand, in a case where the translucent electrode has a film thickness of more than 30 nm, there is a significant reduction in light transmittance. In this case, there is a risk that the luminance and the light-emitting efficiency might be reduced.

Here, in a case where the light emitted from the organic light-emitting layer is taken out from the first electrode 20 (second electrode 21), it is preferable to employ, as the second electrode 21 (first electrode 20), an electrode which does not transmit light. Examples of such en electrode encompass a black electrode (such as tantalum and carbon), a reflective metal electrode (such as aluminum, silver, gold, an aluminum-lithium alloy, an aluminum-neodymium alloy, and an aluminum-silicon alloy), and an electrode in which a transparent electrode and the reflective metal electrode (reflecting electrode) are combined with each other.

Edge Cover

Figure 6:
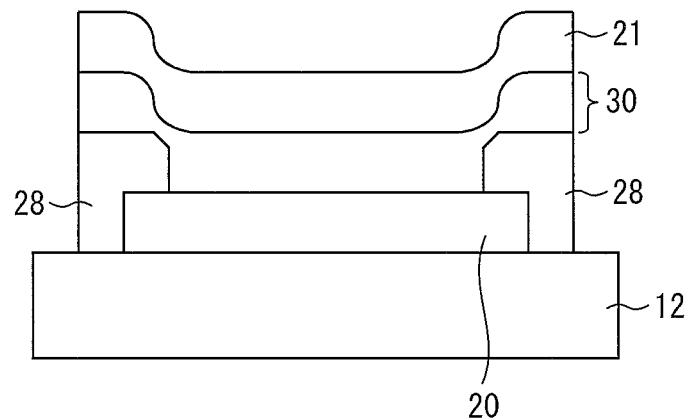
FIG. 6 is a cross-sectional view illustrating an arrangement of the display section formed on the panel of the image display provided in the image display device illustrated in FIG. 1.
Figure 7:
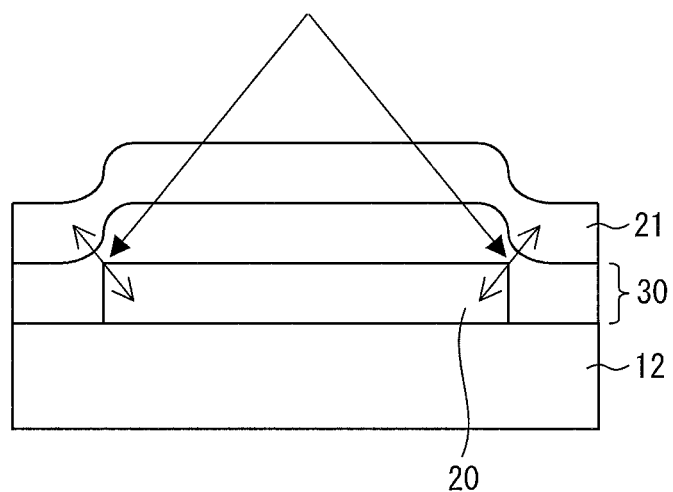
FIG. 7 is a cross-sectional view illustrating a comparative arrangement in which no edge cover is provided.

It is possible to provide an edge cover at an edge part of the first electrode 20 in order to prevent a leakage of a current between the first electrode 20 and the second electrode 21. Here, the following description deals with an arrangement and effects of the edge cover with reference to FIGS. 6 and 7. FIG. 6 is a cross-sectional view illustrating an arrangement in which the edge cover is provided. FIG. 7 is a cross-sectional view illustrating a comparative arrangement with respect to the arrangement illustrated in FIG. 6. In the comparative arrangement, no edge cover is provided. An edge cover 28 is provided at an edge part of the first electrode 20 (see FIG. 6). In the case where no edge cover is provided, a thickness of the organic layer 30 becomes thin, and therefore a leakage is generated between the first electrode 20 and the second electrode 21 (see FIG. 7). The edge cover 28 can prevent such a leakage effectively.

The edge cover can be formed, by use of an insulating material, by a known method such as an EB vapor-deposition method, a sputtering method, an ion plating method, and a resistance heating vapor-deposition method. A pattern of the edge cover can be developed by a photolithography method of a known dry or wet process. Note, however, that the present invention is not limited to these methods.

As the insulating material, a known material can be used. According to the present invention, the insulating material is not particularly limited, as long as the insulating material transmits light. Examples of the insulating material encompass SiO, SiON, SiN, SiOC, SiC, HfSiON, ZrO, HfO, and LaO.

Further, it is preferable that the edge cover has a film thickness in a range of 100 nm to 2000 nm. In a case where the edge cover has a film thickness of not more than 100 nm, an insulating property becomes insufficient. In this case, a leakage might occur between the first electrode and the second electrode, and the leakage might cause an increase in power consumption and such a defect that no light is emitted. On the other hand, in a case where the edge cover has a thickness of not less than 2000 nm, a process for forming a film (edge cover) requires a longer time period. This reduces production efficiency and also causes such a defect that a wiring of the second electrode 21 is broken at the edge cover.

Sealing Film, Sealing Substrate

Further, in order to carry out sealing further on an outermost surface (second electrode 21), it is possible to provide, via an inorganic film or a resin film, (i) a sealing substrate (not illustrated) made from plastic or the like, or (ii) a sealing film (not illustrated).

The sealing substrate or the sealing film can be made from a known sealing material by a known sealing method. Specifically, it is possible to form the sealing substrate or the sealing film by sealing an inactive gas such as nitrogen gas and argon gas by use of glass, a metal or the like. Further, it is preferable to mix an absorbent material (such as barium oxide) or the like in the inactive gas thus sealed. With the arrangement, it is possible to reduce effectively deterioration of the organic EL due to water. Furthermore, it is also possible to form the sealing film by spraying or attaching a resin on/to the second electrode 21 by a spin coat method, an ODF method, or a laminating method. Moreover, it is also possible to form the sealing film in such a manner that (i) an inorganic film (such as SiO, SiON, and SiN) is formed on the second electrode 21 by a plasma CVD method, an ion plating method, an ion beam method, or a sputtering method, and then (ii) a resin is further applied to or attached to the inorganic film by a spin coat method, an ODF method, or a laminating method. This sealing film can prevent oxygen or water from being mixed in the organic EL element from an outside, so as to allow the organic EL element to have a longer lifetime. Note, however, that the present invention is not limited to these members and these methods. Further, in a case where the light emitted from the organic layer 30 is taken out from the second electrode side, i.e., from the front side of the panel 11 (the near side in FIG. 1), it is necessary for either the sealing film or the sealing substrate to be made from an optically transparent material.

Note that it is not essential to provide the sealing substrate. It is possible to carry out the sealing with only the inorganic film and the resin film.

Polarizer

Further, it is possible to provide the polarizer on the display section 13 on a light-emitting side, on which side the light is taken out from the organic light-emitting layer (organic layer 30).

As the polarizer, a combination of a linear polarizer and a λ/4 plate can be used. Here, by providing the polarizer, it is possible to prevent external light from being reflected from various lines, electrodes, a surface of the substrate, or a surface of the sealing substrate. This can improve contrast of the image display device.

[H Scan]

The H scan 14 illustrated in FIGS. 1 and 2 is a horizontal scan, and is formed on the adjacent surface 12b' of the substrate 12 of each of the plurality of panels 11. The H scan extends along one of long sides of the rectangular display section 13, and has a length which is identical or substantially identical with that of the one of the long sides.

A group of terminals are arranged in a horizontal direction in the vicinity of the one of long sides of the display section 13 of each of the plurality of panels 11, and are connected to the H scan 14.

[V Scan]

A V scan 15 illustrated in FIGS. 1 and 2 is a vertical scan, and is formed on the flat surface 12a' of the substrate 12 of each of the plurality of panels 11. The V scan 15 extends along one of short sides of the rectangular display section 13, and has a length which is identical or substantially identical with the one of the short sides.

A group of terminals are arranged in a vertical direction in the vicinity of the one of the short sides of the display section 13 of each of the plurality of panels 11, and are connected to the V scan 15.

[3] Coupling of Panels

The image display 10 illustrated in FIG. 1 is constituted such that a predetermined number of panels 11, each having the aforementioned arrangement, are coupled together (three panels 11 in FIG. 1).

In order to prevent pixels from being out of alignment in coupling the panels 11 together, it is preferable that each of the panels 11 includes alignment sections for the alignment of the pixels.

Figure 8:
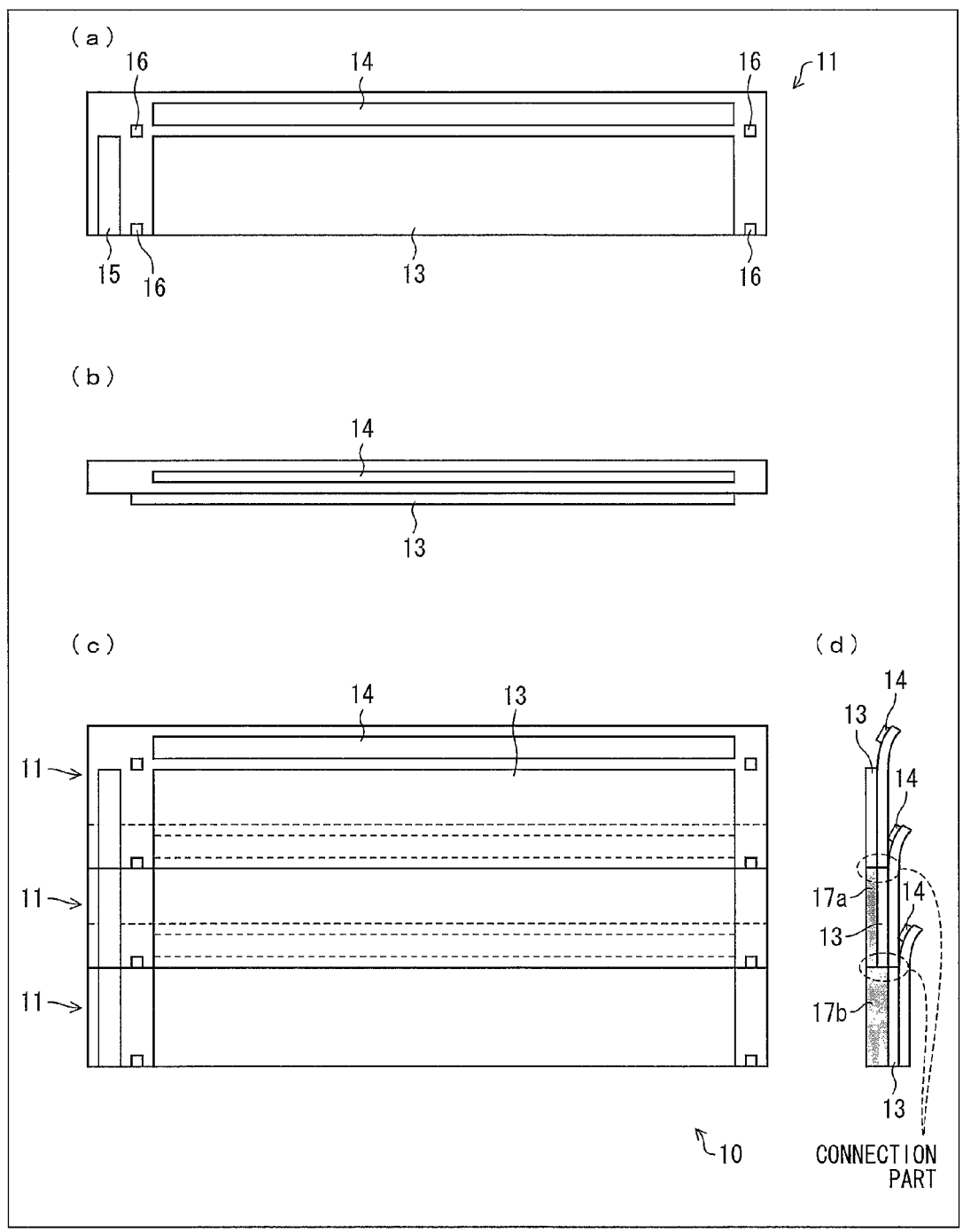
FIG. 8 is a view illustrating how the panels of the image display provided in the image display device illustrated in FIG. 1 are connected to each other: (a) of FIG. 8 is a front view illustrating one panel; (b) of FIG. 8 is a top view illustrating the panel; (c) of FIG. 8 is a front view (viewed from a display section side) illustrating an image display in which the panels are coupled together; and (d) of FIG. 8 is a side view illustrating the image display illustrated in (c) of FIG. 8.
Figure 9:
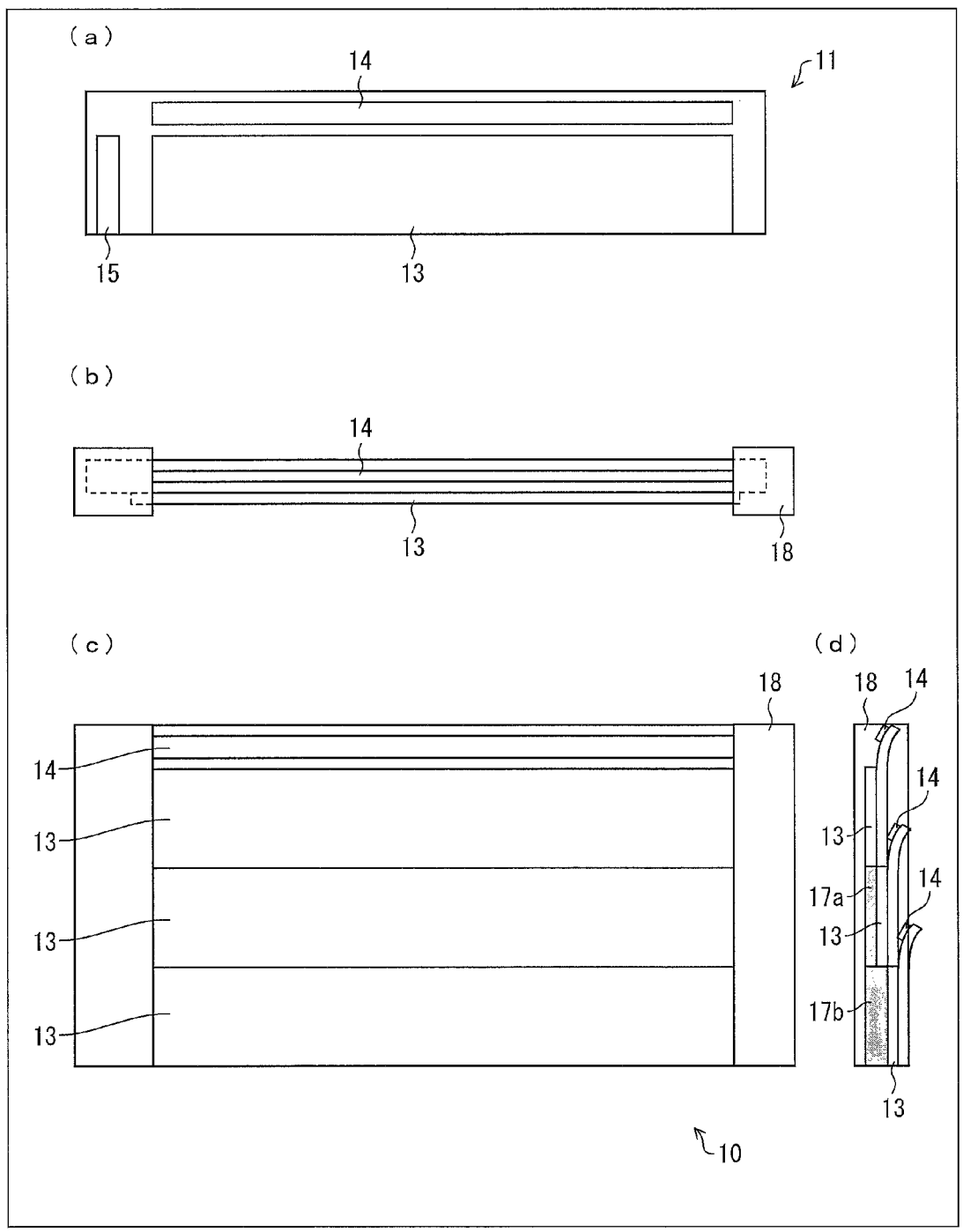
FIG. 9 is an explanatory view illustrating another example of how the panels of the image display provided in the image display device illustrated in FIG. 1 are coupled together.

(a) through (d) of FIG. 8 are explanatory views, each illustrating combination of the panels 11. As illustrated in (a) of FIG. 8, alignment sections 16 are formed on a surface of the substrate 12 of each of the panels 11.

Each of the alignment sections 16 is provided (i) on the flat surface 12a' serving as the region 12a where the display section 13 is formed, and (ii) away from both the display section 13 and the V scan 15. In (a) of FIG. 8, four alignment sections 16 are provided such that (i) two alignment sections 16 are provided (1) at a border part between the flat surface 12a' and the adjacent surface 12b' and (2) on a right side and on a left side with respect to the display section 13, respectively, and (ii) the other two alignment sections 16 are provided (I) on a side opposite to the adjacent surface 12b' side and (II) on the right side and on the left side with respect to the display section 13, respectively.

Note, however, that the positions of the alignment sections 16 are not limited to the flat surface 12a'. It is possible to provide the alignment sections 16 on a back surface of each of the panels 11 (substrate 12), that is, a back surface with respect to the flat surface 12a'. For example, in a case where (i) the alignment sections 16 provided at the border part between the flat surface 12a' and the adjacent surface 12b' of each of the panels 11 have a projected structure, and (ii) the other alignment sections 16, provided on an edge part opposite to the adjacent surface 12b' on the back surface of each of the panels 11 (substrate 12), have a recessed structure, it is possible to couple the panels 11 together with high accuracy by inserting the projected structure into the recessed structure (as illustrated in (d) of FIG. 8). Note that the recessed structure can be such a cutoff structure that parts of the substrate 12 are cut off in a downward direction in FIG. 8 (as the alignment sections 16 provided on the edge part opposite to the adjacent surface 12b', illustrated in (a) of FIG. 8).

Note, however, that the alignment sections 16 are not limited to the ones described above. It is possible to, instead of providing the alignment sections 16, (i) draw marks on each of the panels 11, or (ii) provide other components which are prepared independent of each of the panels 11.

As a specific method of coupling the panels 11 together, a method of connecting the panels 11 along long sides of the panels 11 can be employed (see (c) and (d) of FIG. 8). This makes it possible to connect adjacent ones of the panels 11 to each other. An adhesive can be used to connect adjacent ones of the panels to each other. Note, however, that the present invention is not limited to this. For example, with the arrangement in which the alignment sections having the projected structure and the alignment sections having the recessed structure are used and the projected structure is inserted into and fixed to the recessed structure, it is possible to couple the panels together with high accuracy without using an adhesive or the like. Further, in a case where the panels 11 are coupled together via a flexible member (such as plastic and a metal), the image display 10 can be folded if necessary. This arrangement is convenient for a user to move and install the image display 10, particularly in a case where the image display 11 is installed at a position, and then is carried out of the position to another position to be installed at the another position.

The coupled panels 11 have such an arrangement that the adjacent surface 12b' of the adjacent region 12b of each substrate 12 faces a back surface of the substrate 12 of another panel 11 (an adjacent panel 11 in the combination of panels 11), that is, the adjacent region 12b projects on the back surface side of the substrate 12 (see (d) of FIG. 8). In other words, when viewed from above, the adjacent surface 12b' projects from the back surface side of the substrate 12 so as to face upward (see (b) of FIG. 8).

Here, in a case where the panels 11 are coupled together as described above, steps are generated between the display sections 13 of the panels 11 (see (d) of FIG. 8). This reduces display quality. In view of this, according to the present embodiment, in order to eliminate these steps, optical system adjusting substrates 17a and 17b are provided. In the connection structure illustrated in (d) of FIG. 8, the display section 13 of a second uppermost panel 11 is positioned on the back surface side with respect to the display section 13 of an uppermost panel 11. Accordingly, a step between them is eliminated by providing the optical system adjusting substrate 17a having the same thickness as that of the step on the surface of the display section 13 of the second uppermost panel 11. Further, in (d) of FIG. 8, the display section 13 of a third uppermost panel 11 is positioned on the back surface side with respect to the display section 13 of the second uppermost panel 11. Here, a step between the display sections 13 of the uppermost panel 11 and the third uppermost panel 11 has a thickness greater than that of the step between the display sections 13 of the uppermost panel 11 and the second uppermost panel 11. In view of this, according to the present embodiment, the step is eliminated by providing the optical system adjusting substrate 17b on the surface of the display section 13 of the third uppermost panel 11, which optical system adjusting substrate 17b has a thickness that is (i) greater than that of the optical system adjusting substrate 17a provided on the surface of the display section 13 of the second uppermost panel 11, and (ii) the same as that of the step between the display sections 13 of the uppermost panel 11 and the third uppermost panel 11 (see (d) of FIG. 8). As described above, by providing the optical system adjusting substrates 17a and 17b, it is possible to realize a flat display surface of the image display 10.

Note, however, that the connection structure is not limited to the one illustrated in (c) and (d) of FIG. 8. For example, it is possible to provide the panels 11 in an alignment frame 18 (see FIG. 9). The frame 18 is designed to have a thickness in accordance with a thickness of the image display 10. By providing the panels 11 in the frame 18, it is possible to enhance strength of the image display 10 in which the plurality of panels 11 are coupled together. The high strength of the image display 10 is a significant advantage as a product.

Figure 10:
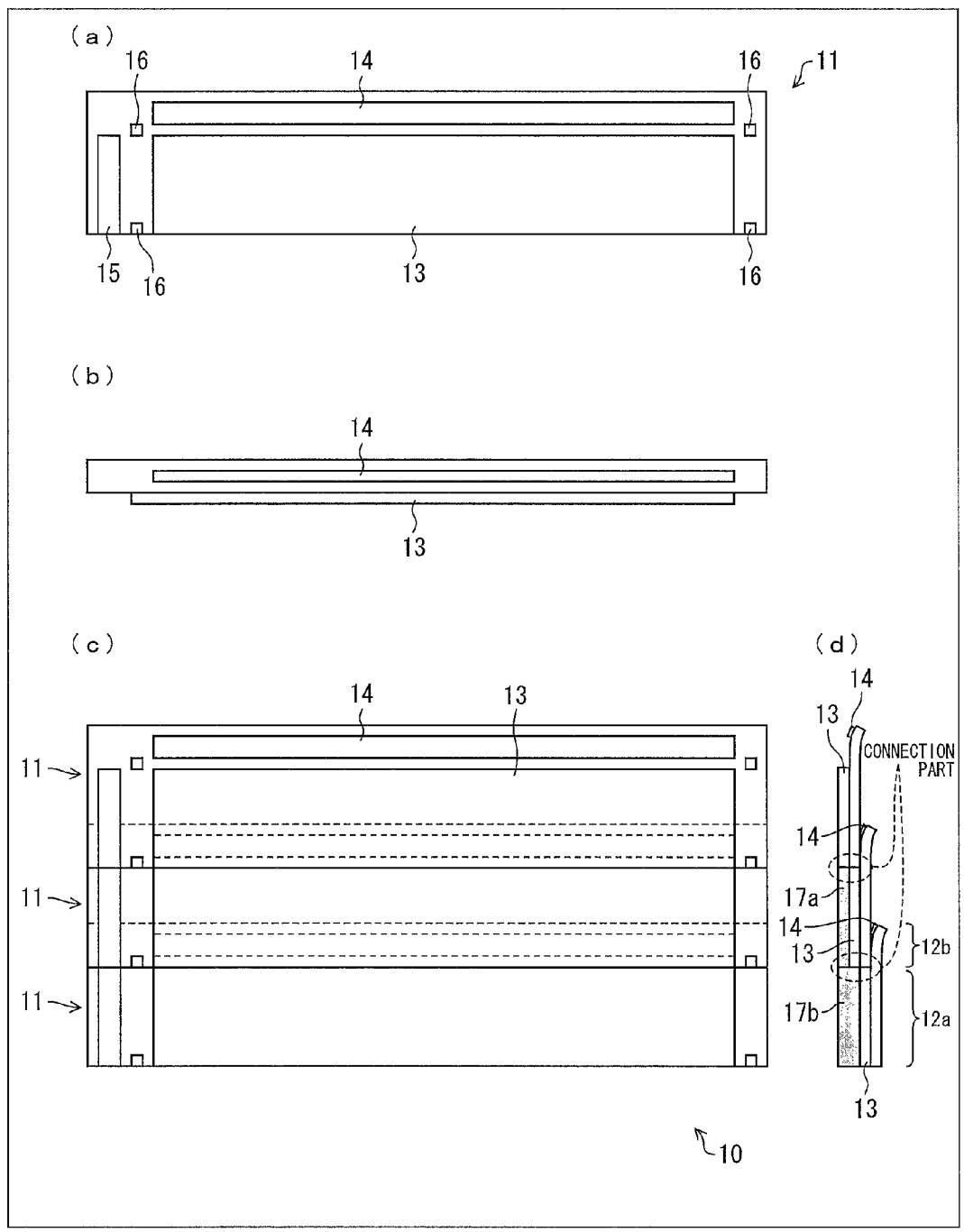
FIG. 10 is an explanatory view illustrating another example of how the panels of the image display provided in the image display device illustrated in FIG. 1 are coupled together.
Figure 11:
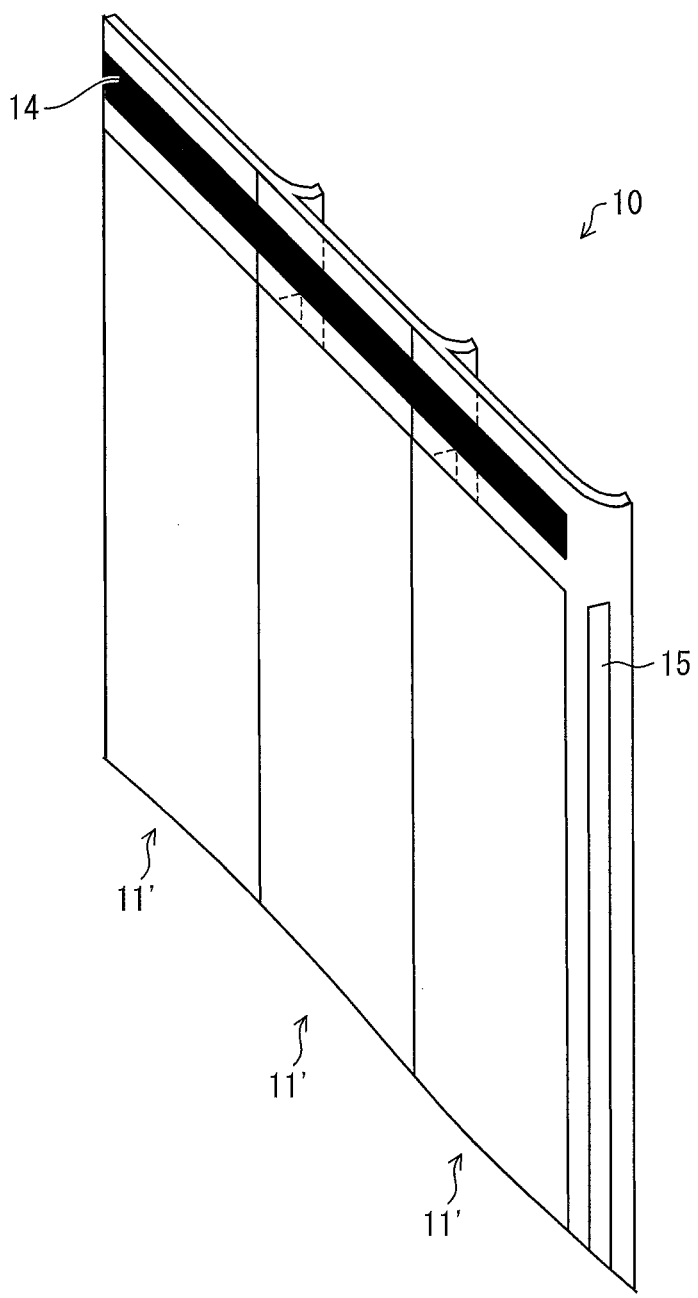
FIG. 11 is a perspective view illustrating another example of how the panels of the image display provided in the image display device illustrated in FIG. 1 are coupled together.

Further, it is preferable to connect adjacent ones of the panels 11 to each other via a flexible base. With this arrangement, particularly, it is preferable to make the substrate 12 of each of the panels 11 from a flexible substrate material, as illustrated in FIG. 10. This makes it possible to bend the adjacent region 12b if necessary. Accordingly, it becomes significantly easy to carry the image display 10. In a case where adjacent ones of the panels 11 are connected to each other with the use of the substrates 12 each being made from the flexible base as described above, it is possible, for example, to couple the panels 11 such that an edge part of the flat surface 12a' of a certain panel 11 (substrate 12), which edge part is on the back surface side and on a side opposite to the adjacent surface 12b' side of the certain panel 11, and the adjacent surface 12b' of another panel 11 are attached to each other (see a part surrounded by a dotted line in (d) of FIG. 10).

Furthermore, by using the substrate 12 made from the flexible material, it becomes unnecessary to provide independently a flexible base. That is, it is possible to reduce the number of components. This makes it possible to have a reduction in production cost. Note, however, that the present invention is not particularly limited to these.

In the present embodiment, the panels 11 whose long sides extend in a horizontal direction are combined with each other in a vertical direction. Note, however, that the present invention is not limited to this. It is possible to combine panels 11' with each other in a horizontal direction, which panels 11' have long sides extending in the vertical direction (see FIG. 11). It is also possible to carry out the driving by (i) connecting the H scan 14 to a conventional source driver externally provided and (ii) connecting the V scan 15 to a conventional gate driver externally provided. Alternatively, it is possible to carry out the driving by (i) connecting the H scan 14 to the conventional gate driver externally provided and (ii) connecting the V scan 15 to the conventional source driver externally provided.

(Effects of Arrangement of Present Embodiment)

As described above, according to the present embodiment, a group of terminals, which (i) extend from an organic electroluminescence element and (ii) are arranged in a direction (longitudinal direction) of long sides of rectangular display section 13, can be extended to an adjacent surface 12b', and can be connected to a drive circuit on the adjacent surface 12b'.

With the arrangement in which the drive circuit is arranged as described above, it is possible to combine (couple) a panel 11 and another panel 11 with each other without any gap between a display section 13 of the panel 11 and a display section 13 of the another panel 11. This is because the adjacent surface 12b' of the panel 11 to which the drive circuit is arranged projects on a back surface side of the substrate 12 in the vicinity of a connection part (border of the connection part) between the display section 13 of the panel 11 and the display section 13 of the another panel 11.

With the arrangement, it is possible for a viewer to view the display section 13 without noticing the adjacent surface 12b' from a connection part between the panels 11. Accordingly, the user can view a high-precision image displayed on a single large display surface in which the display sections 13 of the panels 11 are combined with each other without any gap between the display sections 13.

Further, according to the arrangement of the present embodiment, the panels 11 are coupled together such that the adjacent surface 12b' of each of the panels 11 projects on a back surface side of the panel 11. Accordingly, it is possible to couple the panels 11 without any limitation in the number of panels 11 to be coupled together. It is therefore possible to form a desired large-screen display surface.

Furthermore, unlike a conventional arrangement, it is possible to reduce, to a desired area, a size of each of the panels 11 to be combined. Accordingly, it is possible to realize a panel which is compact and can have a reduction in production cost.

Moreover, according to the arrangement of the present invention, the display section 13 has a rectangular shape. Accordingly, in a case where an organic EL element is provided, it is possible to carry out a mask process in which a material is applied to only a desired part by a mask vapor-deposition method with the use of a conventional shadow mask. Further, it is also possible to realize high alignment accuracy easily. Furthermore, there is no influence of misalignment due to flexure of the shadow mask.

Moreover, since a device for producing a large panel can be more compact, it is possible to have a reduction in production cost. Accordingly, by providing a light-emitting panel device of the present invention, it is possible to provide a large organic EL image display device at low cost.

Further, according to the present invention, a panel and another panel are combined with each other along long sides of their display sections 13. Accordingly, as compared with a case where the panels are combined with each other along short sides of their display sections 13, it is possible to manufacture a large EL image display device with a smaller number of panels 11 each of which has the same width (a length of a short side of the display section 13 of each panel 11) as the above case. Specifically, in a case of a 65-inch hi-vision television, a horizontal length (a long side of an end product)×a vertical length (a short side of the end product) is 1400 mm×800 mm. In a case where the image display device of the present embodiment is constituted such that adjacent ones of the panels 11 each having a width of 100 mm are combined with each other in the vertical direction, each of the panels 11 has a size of 1400 mm×100 mm. In this case, an end single display surface is completed with eight panels 11. On the other hand, in a case where adjacent ones of the panels 11 are combined with each other in a horizontal direction, each of the panels 11 has a size of 800 mm×100 mm. In this case, the end single display surface is completed with fourteen panels 11. According to the present embodiment, it is thus possible to realize a large light-emitting panel device with a smaller number of connection sections.

(Modified Example of Present Embodiment)

According to the present embodiment, an image display (image display device) has an arrangement in which adjacent ones of a plurality of panels 11 each having a display section 13 are combined with each other. Note, however, that the present invention is not limited to this. It is possible to (i) design the display section 13 as a light-emitting section which does not display an image but only controls emission/non-emission of light, and (ii) manufacture an illumination device (an organic EL illumination device in a case where the light-emitting section has an organic EL element) in which adjacent ones of the plurality of panels each having the light-emitting section are combined with each other. The present invention is applicable to such an illumination device. That is, the present invention is applicable to any device as long as the device has an arrangement in which (i) adjacent ones of a plurality of panels are combined with each other, and (ii) each of the plurality of panels has a rectangular light-emitting section each having a plurality of light-emitting elements which control emission of light by being supplied with a current or a voltage. Here, in a case where an entire surface of the light-emitting section is driven like an organic EL illumination device, it is possible to drive the entire surface, for example, in such a manner that (i) groups of terminals of the panels, each being provided in the vicinity of a long side of the light-emitting section of each of the panels, are connected to each other directly and electrically, and then, (ii) the groups of terminals provided in the vicinity of long sides of the light-emitting sections of the panels are electrically connected to an external power supply circuit and another group of terminals provided in the vicinity of a short side of the light-emitting section of each of the panels are electrically connected to another external power supply circuit. Further, it is also possible to drive the entire surface by connecting, electrically and directly, (i) the group of terminals in the vicinity of the long side of the light-emitting section of each of the panels to an external power supply circuit and (ii) the group of terminals in the vicinity of the short side of the light-emitting section of each of the panels to another external power supply circuit directly and respectively.

Moreover, according to the present embodiment, the display section 13 has an organic EL element. Note, however, that the present invention is not limited to this. It is possible to use a light-emitting element in place of the organic EL element, as long as it has a first electrode and a second electrode, and can emit light by being supplied with a current or a voltage. Specifically, the light-emitting element may be an inorganic EL element or an inorganic LED.

Figure 12:
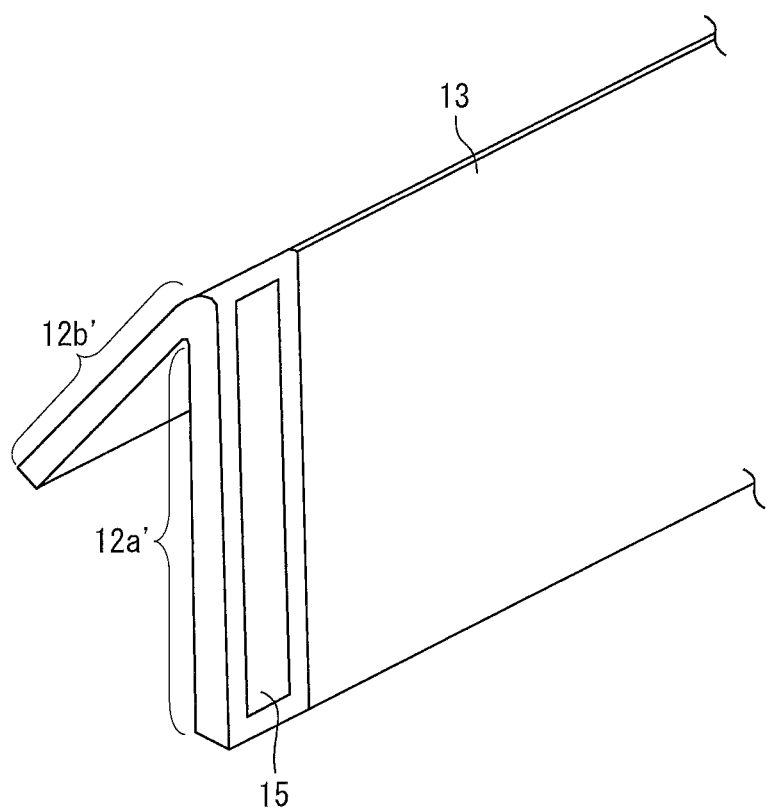
FIG. 12 is a perspective view illustrating another example of how the panels of the image display provided in the image display device illustrated in FIG. 1 are coupled together.

Further, according to the present embodiment, the adjacent surface 12b' of the substrate 12 is curved. Note, however, that the present invention is not limited to this. FIG. 12 is a perspective view partially illustrating another arrangement of the adjacent surface 12b', for example. It is possible that the adjacent surface 12b' is bent, as illustrated in FIG. 12.

Finally, the following description deals with details of an image display device (image display) in accordance with the present embodiment more specifically, with reference to examples. Note, however, that the present invention is not limited to these examples.

(Conclusion)

As described above, a light-emitting panel device of the present invention includes: a plurality of panels each having a rectangular light-emitting section in which a plurality of light-emitting elements are arranged on a surface of a base, each of the plurality of light-emitting elements (i) having a first electrode and a second electrode, and (ii) emitting light by being supplied with a current or a voltage, the base being curved or bent at one of two edge parts of the surface of the base so as to provide an adjacent surface which (I) projects on a back surface side opposite to the surface and (II) is adjacent to the one of two edge parts of the surface, the two edge parts extending along a pair of long sides constituting the rectangular light-emitting section, respectively, the adjacent surface being provided with a group of terminals thereon, which extend from the first electrode of each of the plurality of light-emitting elements of the rectangular light-emitting section, adjacent ones of the plurality of panels being combined with each other in such a manner that (1) a rectangular light-emitting section of one of the plurality of panels and a rectangular light-emitting section of an adjacent one of the plurality of panels are arranged to face in an identical direction, and (2) one of edge parts of a surface of a base of the one of the plurality of panels and one of edge parts of a surface of a base of the adjacent one of the plurality of panels are coupled together so that the rectangular light-emitting section of the one of the plurality of panels and the rectangular light-emitting section of the adjacent one of the plurality of panels are arranged with respect to each other.

With the arrangement, it is possible to (i) cause terminals to extend, to the adjacent surface, from an electrode of each of the plurality of light-emitting elements (e.g., organic electroluminescence elements) arranged in a direction (longitudinal direction) of long sides of the rectangular light-emitting section, and (ii) cause the terminals to be connected to a drive circuit on the adjacent surface.

With the arrangement in which the drive circuit is arranged as described above, it is possible that, in a case where the one of the plurality of panels and the adjacent one of the plurality of panels are combined with each other, the light-emitting sections of these panels are combined (coupled) with each other without any gap between the light-emitting sections. This is because, here, the adjacent surface (of the one of the plurality of panels), on which the drive circuit is arranged, projects on a back surface side of the base in the vicinity of a connection part (a border of the connection part) between the light-emitting sections of the one of the plurality of panels and the adjacent one of the plurality of panels.

As described above, according to the arrangement of the present invention, it is possible that (i) the adjacent surface is not viewable to a user from the connection part between the panels, and (ii) the one of the plurality of panels and the adjacent one of the plurality of panels are coupled together in such a manner that (I) longitudinal directions of the rectangular light-emitting sections of the one of the plurality of panels and the adjacent one of the plurality of panels are parallel to each other, and (II) the edge parts of the surfaces of the bases are coupled with each other. Accordingly, by coupling the panels together with the arrangement, it is possible to couple the panels together without any limitation in the number of panels to be coupled together. Further, it is possible to realize a single large light-emitting section by coupling the light-emitting sections of the panels together without any gap between the light-emitting sections.

Further, in other words, according to the arrangement of the present invention, since the panels can be coupled together without any limitation in the number of panels to be coupled together, it is possible to reduce, to a desired size, an area of each of the panels to be coupled together. It is therefore possible to realize a panel which is compact and can have a reduction in production cost.

Furthermore, according to the arrangement of the present invention, the light-emitting section has a rectangular shape. Accordingly, even in a case where an organic electroluminescence (EL) element is provided as the light-emitting element, it is possible that (i) a mask process is easily carried out, in which mask process a material is applied to only a desired part by a mask vapor-deposition method by use of a conventional shadow mask, (ii) high alignment accuracy of the shadow mask is realized, and (iii) there is no influence of misalignment due to flexure of the mask.

Moreover, since a device for producing such a large panel can have a more compact body, it is possible to have a reduction in production cost. Accordingly, by providing the light-emitting panel device of the present invention, it is possible to provide a large organic EL display, an organic EL display device, or an organic EL illumination device at low cost.

Further, according to the present invention, as described above, the panels are combined with each other along long sides of the light-emitting sections of the panels. Accordingly, as compared with a case where the light-emitting sections are combined with each other along short sides of the light-emitting sections of the panels, it is possible to produce a large image display device with the panels the number of which is less than the above case (in a case where the panels having the same width (a length of a short side of each panel) as in the above case). Specifically, in a case of a 65-inch high vision television, a size of a panel (as a completed large panel) is 1400 mm (a long side of an end single panel)×800 mm (a short side of the end single panel). Here, each of the panels has a width of 100 mm, for example. In a case where the image display device (later described) of the present invention is constituted such that the panels are combined with each other along the long sides of the light-emitting sections of the panels, each of the panels has a size of 1400 mm×100 mm. In this case, the end single panel is completed with eight panels. On the other hand, in a case where the panels are combined with each other along the short sides of the light-emitting sections of the panels, each of the panels has a size of 800 mm×100 mm. In this case, the end single panel is completed with fourteen panels.

As a result, it is possible to realize a large light-emitting panel device with a small number of connection sections. By applying the light-emitting panel device to an image display device or an illumination device, it is possible to manufacture a large image display device or a large illumination device.

Further, specifically, the light-emitting panel device of the present invention can be arranged such that the one of the plurality of panels and the adjacent one of the plurality of panels are combined with each other in such a manner that (i) the one of edge parts of the surface of the base of the one of the plurality of panels is adjacent to the adjacent surface of the base of the one of the plurality of panels, (ii) the one of edge parts of the surface of the adjacent one of the plurality of panels is opposite to the adjacent surface of the base of the adjacent one of the plurality of panels, and (iii) the one of edge parts of the surface of the base of the one of the plurality of panels and the one of edge parts of the surface of the adjacent one of the plurality of panels are coupled together.

Furthermore, in addition to the arrangement, the light-emitting panel device of the present invention can be arranged such that each of the plurality of light-emitting elements is an organic electroluminescence element in which an organic layer including an organic light-emitting layer is provided between the first electrode and the second electrode, and the group of terminals, extending from the first electrode of each of the plurality of organic electroluminescence elements, are arranged on the adjacent surface along one of the long sides of the rectangular light-emitting section.

With the arrangement, the terminals are not provided on the surface where the rectangular light-emitting section is formed. Accordingly, it is possible to eliminate visual discomfort due to existence of the terminals between the light-emitting sections.

Further, in addition to the arrangement, the light-emitting panel device of the present invention is preferably arranged such that each of the plurality of panels is arranged such that one of edge parts of the surface of the panel, being on an opposite side with respect to the adjacent surface of the panel, and one of edge parts of the rectangular light-emitting section of the panel, being on the opposite side with respect to the adjacent surface of the panel, overlap each other.

With the arrangement, in a case where the rectangular light-emitting section is viewed from a front side of the rectangular light-emitting section, the one of edge parts of the surface of the panel, on the opposite side with respect to the adjacent surface of the panel, cannot be viewed outside the one of edge parts of the rectangular light-emitting section, on the opposite side with respect to the adjacent surface of the panel.

Accordingly, in a case where the panels are combined with each other, it is possible to realize a large light-emitting section without any gap between the panels.

Furthermore, in addition to the arrangement, the light-emitting panel device of the present invention is preferably arranged such that no sealing area is provided on the adjacent surface.

With the arrangement, it is possible to curve or bend the adjacent surface without any stress.

In a case of organic EL, there is a problem of an insufficient adhesiveness between a substrate on which the organic EL is provided and a sealing substrate. Particularly, in an organic EL section, an adhesiveness between an organic layer and an electrode (generally, a cathode) is low. For this reason, in a case where the organic EL section is curved, there is a risk that, particularly, the organic layer and the electrode might be detached from each other.

Meanwhile, according to the arrangement of the present invention, it becomes possible to form the adjacent surface by curving or bending the organic EL section more effectively. Accordingly, it becomes possible to provide a large organic EL display, an organic EL display device, and an organic EL illumination device, each of which (i) eliminates a problem of a connection part, (ii) has high display quality, and (iii) can be manufactured at low cost.

Moreover, in addition to the arrangement, the light-emitting panel device of the present invention is preferably arranged such that the base of each of the plurality of light-emitting elements is provided with an alignment section(s) so that bases of the plurality of light-emitting elements are capable of being aligned with respect to each other.

With the arrangement, in a case where adjacent ones of the plurality of panels are attached to each other, the organic electroluminescence elements can be prevented from being out of alignment at the connection part.

Particularly, in a case where the light-emitting panel device of the present invention is applied to an image display device (i.e., an organic EL display device), and the organic electroluminescence elements (i.e., pixels) are out of alignment with respect to each other at the connection part between the panels, a defect is caused in a displayed image. For example, in a case of a 65-inch high-vision television, each sub-pixel has a size of 210 μm×70 μm. In this case, if the panels are out of alignment by 70 μm, the alignment of the sub-pixels is deviated by 1 sub-pixel at the connection part. This causes the connection part to be viewable to a viewer. Meanwhile, according to the arrangement of the present invention, the alignment section is provided. With the arrangement, it is possible to prevent the organic electroluminescence elements from being out of alignment, and therefore cause a display device to display an image without any defect.

Further, in case where the alignment section is provided at the connection part, the alignment section may be viewable to the viewer as a part of the connection part between the panels. It is therefore preferable to provide the alignment section in a region which is different from the connection part.

Further, in addition to the arrangement, the light-emitting panel device of the present invention is preferably arranged such that a group of terminals extending from the second electrode of each of the plurality of light-emitting elements are arranged on the surface along one of a pair of short sides constituting the rectangular light-emitting section.

With the arrangement, the terminals extending from the second electrode of the light-emitting section of the panel are arranged on the surface of the panel. Accordingly, it is possible to have a reduction in a length of a line connected between the second electrode and each of the terminals. In a case where the organic electroluminescence element is used as the light-emitting element, the organic electroluminescence element is driven by a current. That is, the organic electroluminescence element requires a current to emit light. For this reason, a current supply line is connected to the second electrode. Here, there has been known that, with a conventional display (display device) baying a long current supply line, when a current flows through the long current supply line, a resistance component of the power source supply line causes problems of an increase in power consumption and heat generation. In order to solve the problems, the above reduction in the length of the current supply line, achieved in accordance of the present invention, is quite effective. Particularly, in a case of a large high-definition display (display device), it is necessary for the current supply line to supply a higher current with an increase in the number of pixels and with an increase in a pixel area due to an increase in a size of a display region of the display (display device). For this reason, with such a large high-definition display, the above problems become further significant. According to the present invention, it becomes possible to solve the problems caused by the current flowing through the current supply line. It becomes therefore possible to reduce power consumption and heat generation significantly.

As a result, it is possible to manufacture a large light-emitting panel device which has a reduction in power consumption and a reduction in heat generation. By providing the large light-emitting panel device in an image display device, it is possible to manufacture a large image display device whose display quality is high.

Furthermore, in addition to the arrangement, the light-emitting panel device of the present invention can be arranged such that the base of each of the plurality of light-emitting elements is a plate member. Further, the base is not limited to the plate member, and may be a flexible base.

It is preferable that the base is made from a metal or plastic.

With the arrangement, it becomes possible to manufacture the adjacent surface by curving or bending the base without any stress.

With a conventional arrangement, since a panel is constituted by a glass substrate having a thickness of approximately 0.7 mm, it is impossible to bend the panel. For this reason, with the conventional arrangement, in a case where the panel is curved like the present invention, it is necessary to manufacture the panel by connecting a flexible plastic member or the like to only a bending section of the glass substrate. This increases a production cost, and also increases a risk that a defect might be caused in the connection part between the panels. According to the present invention, the base is made from a metal or plastic, so that the base itself can be bent.

As a result, it becomes possible to curve or bend the substrate itself of the panel. It is therefore possible to realize a light-emitting panel device which has a reduction in production cost. By providing the light-emitting panel device in an image display device or an illumination device, it is possible to allow the image display device or the illumination device to have a reduction in production cost.

Moreover, the base can be made from an iron-nickel alloy, a linear coefficient of expansion of which is not more than $1\times10^{-5}/^\circ C$.

With the arrangement, the substrate of the organic EL is made from the metal having a thermal expansibility which is identical with that of glass. It is therefore possible to use a general TFT process.

Further, an image display device of the present invention includes a light-emitting panel device having the arrangement described above, and the rectangular light-emitting section serves as an image display section for displaying an image.

With the arrangement, the image display device includes a panel (light-emitting panel device) having various effects described above, and the light-emitting section provided in the panel serves as the image display section. It is therefore possible to realize an image display device having a desired size at low cost.

Furthermore, in addition to the arrangement, it is preferable that the image display device of the present invention further includes an active matrix drive element for driving the plurality of light-emitting elements provided in the image display section.

With the arrangement, it is possible to carry out active matrix driving with respect to each pixel. An organic EL display employing the active matrix driving or an organic EL display device employing the active matrix driving can have, for 1 frame, a longer time period in which light is emitted, as compared with an organic EL display employing simple matrix driving or an organic EL display device employing the simple matrix driving. It is therefore possible to set a lower light-emitting luminance for 1 frame. Specifically, the display (a high-vision display, resolution: 1920×1080) is required to have a luminance of 100 cd/m², for example. In the case of the simple matrix driving, it is necessary to obtain a luminance of 108,000 cd/m² (=100 cd/m²×1080) instantaneously. On the other hand, in the case of the active matrix driving, it is possible to use an entire time period for 1 frame as a light-emitting time period. Accordingly, the luminance can be 100 cd/m² (=100 cd/m²×1). It is thus possible to carry out driving with a low voltage. Further, generally, light-emitting efficiency is reduced as the luminance of the organic EL is increased. For this reason, it is possible to carry out the driving in such a range that the light-emitting efficiency is high. It is therefore possible to have a significant reduction in power consumption.

As a result, it is possible to provide a large active matrix driving image display device which has a reduction in power consumption and has high display quality.

Moreover, in addition to the arrangement, the image display device of the present invention is preferably arranged such that each of the plurality of light-emitting elements provided in the display section is an organic electroluminescence element in which an organic layer including an organic light-emitting layer is provided between the first electrode and the second electrode, a power source supply line for supplying electric power to the image display section is connected to the second electrode, and a terminal of the power source supply line is arranged on the flat surface in the vicinity of one of short sides constituting the rectangular light-emitting section serving as the image display section.

With the arrangement, the organic electroluminescence element is driven by a current. That is, the organic electroluminescence element requires a current to emit light. Here, there has been known that, with a conventional display (display device) having a long current supply line, when a current flows through the long current supply line, a resistance component of the power source supply line causes problems of an increase in power consumption and heat generation. According to the present invention, the terminal of the current supply line connected to the second electrode of the light-emitting section of each panel is arranged on the surface of the panel. This makes it possible to have a reduction in a length of the current supply line. This arrangement is significantly effective to solve the above problems. Particularly, in the case of a large high-definition display (display device), it is necessary for the current supply line to supply a higher current with an increase in the number of pixels and with an increase in a pixel area due to an increase in a size of a display region of the display (display device). For this reason, with such a large high-definition display, the above problems become further significant. According to the present invention, it becomes possible to solve the problems caused by the current flowing through the current supply line. It becomes therefore possible to reduce power consumption and heat generation significantly.

As a result, it is possible to manufacture a large light-emitting panel device which has a reduction in power consumption and a reduction in heat generation. By providing the large light-emitting panel device in a display device, it is possible to manufacture a large display device whose display quality is high.

Further, an illumination device of the present invention includes a light-emitting panel device having the arrangement described above, and the rectangular light-emitting section serves as a light source section for emitting illumination light. With the arrangement, it is possible to provide a large light-emitting section, and therefore provide a large illumination device which emits light from the entire light-emitting section.

EXAMPLES

Example 1

Image Display Device

As a substrate 12 (see FIG. 2), a plastic substrate coated with silicon oxide (thickness: 200 nm) was employed. The plastic substrate had a thickness of 0.2 mm, and had a surface having an area of 500 mm×220 mm.

On the surface of the plastic substrate 12, indium-tin oxide (ITO) was provided by a sputtering method so that the surface had a resistance of 10Ω/□. As a result, a transparent electrode (anode), having a film thickness of 200 nm was formed. The transparent electrode was to serve as a first electrode 20.

Next, patterning was carried out by a photolithography method with respect to only a region of 492 mm×220 mm in the surface of 500 mm×220 mm, so as to form the first electrode 20 (see FIG. 4). The first electrode 20 had a stripe pattern having a length of 250 mm and a width of 1 mm.

Next, in order to form an edge cover on an edge part of the first electrode 20, $SiO_2$ (thickness: 200 nm) was provided. Then, patterning was carried out by the photolithography method so that only the edge part of the first electrode 20 was covered with $SiO_2$. According to the present example, the electrode 20 had a narrow rectangular shape, and a part extending by 10 μm from each of ends of four sides of the rectangular shape was covered with $SiO_2$.

After that, the substrate was washed with water. Then, the substrate was subjected to a pure water ultrasonic cleaning process for 10 minutes, and then subjected to an acetone ultrasonic cleaning process for 10 minutes, after that, subjected to an isopropyl alcohol vapor washing process for 5 minutes. Then, the substrate was dried for 1 hour at 100° C.

Here, the display section 13, which was to be provided on the substrate 12 having a size of 500 mm×220 mm, was designed to have a size of 492 mm×200 mm. Further, sealing areas each having a width of 2 mm were provided at upper and lower positions and right and left positions with respect to the display section 13, respectively. A terminal provision region (a region having a V scan 15 in FIG. 2) having a width of 2 mm was provided (i) in the vicinity of one of the short sides of the display section 13 having the rectangular shape and (ii) out of the sealing area. Further, another terminal provision section (adjacent surface) having a width of 2 mm was provided, as a region (adjacent region) where bending was to be carried out, in the vicinity of one of long sides of the display section 13 having the rectangular shape.

Next, the substrate 12 on which the first electrode 20 had been provided through the above processes was fixed to a substrate holder provided in an in-line resistance heating vapor-deposition device illustrated in FIG. 5, and a pressure was reduced to be a vacuum (not more than $1 \times 10^{-4}$ Pa). According to the present example, RGB light-emitting pixels were formed by use of a method in which a material was applied to only a desired part by a mask vapor-deposition method employing a shadow mask 41.

After that, a hole-injection layer 31 (see FIG. 4) having a film thickness of 100 nm was formed in a desired region by a resistance heating vapor-deposition method by use of 1,1-bis-tolylamino-phenyl-cyclohexane (TAPC) as a hole-injection material.

Next, a hole-transport layer 32 (see FIG. 4) having a film thickness of 40 nm was formed in a desired region by the resistance heating vapor-deposition method by use of N,N'-Di(1-naphthyl)-N,N'-diphenyl-1,1'-biphenyl-1,1'-biphenyl-4,4'-diamine (NPD) as a hole-transport material.

Then, a red organic light-emitting layer (thickness: 30 nm) was formed on a desired red light-emitting pixel provided on the hole-transport layer 32 by the method in which a material was applied to only a desired part by use of the shadow mask 41. The red organic light-emitting layer was formed in such a manner that 3-phenyl-4 (1'-naphthyl)-5-phenyl-1,2,4-triazole (TAZ) (host material) and bis(2-(2'-benzo[4,5-a]thienyl) pyridinato-N,C3') iridium (acetylacetonate) ($btp_2Ir$ (acac))

(red phosphorescent light-emitting dopant) were co-deposited at respective vapor-deposition speeds of 1.4 Å/second and 0.15 Å/second.

Next, a green organic light-emitting layer (thickness: 30 nm) was formed on a desired green light-emitting pixel provided on the hole-transport layer 32 by the method in which a material was applied to a desired part by use of the shadow mask 41. The green organic light-emitting layer was formed in such a manner that TAZ (host material), and tris(2-phenylpyridine) iridium (III) (Ir (ppy)$_3$) (green phosphorescent light-emitting dopant) were co-deposited at respective vapor-deposition speeds of 1.5 Å/second and 0.2 Å/second.

Then, a blue organic light-emitting layer (thickness: 30 nm) was formed on a desired blue light-emitting pixel on the hole-transport layer 32 by the method in which a material was applied to only a desired part by use of the shadow mask 41. The green organic light-emitting layer was formed in such a manner that 1,4-bis-triphenylsilyl-benzene (UGH-2) (host material) and bis[(4,6-difluorophenyl)-pyridinato-N,C2']picolinate iridium (III) (Firpic) (blue phosphorescent light-emitting dopant) were co-deposited at respective vapor-deposition speeds of 1.5 Å/second and 0.2 Å/second.

Next, a hole-blocking layer 34 (see FIG. 4) was formed on an organic light-emitting layer 33 (see FIG. 4) formed by the aforementioned method. The hole-blocking layer 34 had a film thickness of 10 nm and was made from 2,9-dimethyl-4,7-diphenyl-1,10-phenanthroline (BCP).

Then, an electron-transport layer 35, made from tris (8-hydroxyquinoline) aluminum (Alq$_3$), was formed on the hole-blocking layer 34.

Next, an electron-injection layer 36 was formed on the electron-transport layer 35. The electron-injection layer 36 had a film thickness of 1 nm and made from lithium fluoride (LiF).

After that, a second electrode 21 (see FIG. 4) was formed. First, the substrate 12 (on which the first electrode 20 and the organic layer 30 had been formed) was fixed to a metal vapor-deposition chamber. Next, a shadow mask (a mask having an opening for forming the second electrode which had a stripe shape having a width of 1 mm and long sides orthogonal to those of a stripe shape of the first electrode 20) for forming the second electrode and the substrate 12 fixed to the metal vapor-deposition chamber were aligned with respect to each other. Then, aluminum was provided with a desired pattern on a surface of the electron-injection layer 36 by a vacuum deposition method. The second electrode 21 having a film thickness of 200 nm was thus formed.

After that, an inorganic protection layer was formed with a desired pattern by use of a shadow mask by the sputtering method. The inorganic protection layer had a film thickness of 1 μm and was made from SiO$_2$. The inorganic protection layer was formed to extend from each of edges of the display section 13 by 2 mm to a corresponding sealing area. Further, on the inorganic protection layer, a parylene film having a film thickness of 2 μm was formed by a vapor-deposition polymerization method. The formation of the inorganic protection layer and the parylene film was carried out 5 times so that a laminate film constituted by 5 layers was formed. The laminate film was used as a sealing film. The panel 11 illustrated in FIG. 2 was thus completed.

Next, three panels 11 thus manufactured were coupled together along long sides of the three panels (the three panels 11 were arranged in a vertical direction), as illustrated in (c) and (d) of FIG. 8, while being aligned with respect to each other by use of markers (alignment sections 16) which were provided (i) in the vicinity of the short sides of the display section 13 and (ii) outside the display section 13.

Note that the adjacent region 12a, provided in the vicinity of one of the long sides of each of the three panels, had been already bent before the three panels were coupled together.

Lastly, terminals provided in the vicinity of one of the short sides and the terminals provided in the vicinity of one of the long sides were connected to external power sources, respectively. An image display device including an image display 10 (see FIG. 1), in which a display region of 492 mm×600 mm was realized by combining adjacent ones of the three display sections 13 with each other, was thus completed.

By employing the image display device thus completed, a desired current was supplied from the external power source to the first electrode and the second electrode, each having a desired stripe shape. As a result, it was confirmed that a desired image was obtained without any defect.

Example 2

Illumination Device

As a substrate 12 (see FIG. 2), a plastic substrate coated with a silicon oxide (thickness: 0.2 mm) was employed. The plastic substrate had a surface having an area of 500 mm×220 mm and had a thickness of 0.2 mm.

On the surface of the plastic substrate 12, indium-tin oxide (ITO) was provided by a sputtering method so that the surface has a resistance of 10Ω/□. A transparent electrode (anode) having a film thickness of 300 nm was thus formed. The transparent electrode was to serve as a first electrode 20.

Next, patterning was carried out by a photolithography method with respect to only a region of 492 mm×216 mm in the surface of 500 mm×220 mm, so that the ITO was left and therefore the first electrode 20 (see FIG. 4) was formed.

Next, in order to form an edge cover on an edge part of the first electrode 20, SiO$_2$ was provided by the sputtering method so that an SiO$_2$ layer having a thickness of 200 nm was provided. Then, patterning was carried out by the photolithography method so that only the edge part of the first electrode 20 was covered with SiO$_2$. According to the present example, the electrode 20 had a rectangular shape, and a part extending by 10 μm from each of ends of four sides of the rectangular shape was covered with SiO$_2$.

After that, the substrate was washed with water. Then, the substrate was subjected to a pure water ultrasonic cleaning process for 10 minutes, and then subjected to an acetone ultrasonic cleaning process for 10 minutes, after that, subjected to an isopropyl alcohol vapor washing process for 5 minutes. Then, the substrate was dried for 1 hour at 100° C.

Here, the display section 13, which was to be provided on the substrate 12 having a size of 500 mm×220 mm, was designed to have a size of 492 mm×200 mm. Further, sealing areas each having a width of 2 mm were provided at upper and lower positions and right and left positions with respect to the display section 13, respectively. A terminal provision region (a region where a V scan 15 is provided in FIG. 2) having a width of 2 mm was provided (i) in the vicinity of one of short sides of the display section 13 having the rectangular shape and (ii) out of the sealing area. Further, another terminal provision section (adjacent surface) having a width of 2 mm was provided, as a region (adjacent region) where bending was to be carried out, in the vicinity of one of long sides of the display section 13 having the rectangular shape.

Next, the substrate 12 on which the first electrode 20 had been provided through the above processes was fixed to a substrate holder provided in an in-line resistance heating vapor-deposition device illustrated in FIG. 5, and a pressure was reduced to be a vacuum (not more than 1×10$^{-4}$ Pa).

According to the present example, RGB light-emitting pixels were formed by use of a method in which a material was applied to only a desired part by a mask vapor-deposition method employing a shadow mask 41.

After that, a hole-injection layer 31 (FIG. 4) having a film thickness of 100 nm and a hole-transport layer 32 (see FIG. 4) having a film thickness of 40 nm were provided in the same manner as Example 1 described above.

Then, a red organic light-emitting layer (thickness: 20 nm) was formed on a desired red light-emitting pixel provided on the hole-transport layer 32 by the method in which a material was applied to only a desired part by use of the shadow mask 41. Materials and vapor-deposition speeds employed in formation of the red organic light-emitting layer were the same as those in Example 1 as described above.

Next, a green organic light-emitting layer (thickness: 20 nm) was formed in the same manner as Example 1, and then, a blue organic light-emitting layer (thickness: 20 nm) was formed in the same manner as Example 1.

Then, a hole-blocking layer 34 (see FIG. 4) (thickness: 10 nm), an electron-transport layer 35 (thickness: 30 nm), and an electron-injection layer 36 (thickness: 1 nm) were formed in the same manner as Example 1.

After that, a second electrode 21 (see FIG. 4) was formed. First, the substrate 12 (on which the first electrode 20 and the organic layer 30 had been formed) was fixed to a metal vapor-deposition chamber. Next, a shadow mask (a mask having an opening for forming the second electrode so that a periphery of the second electrode surrounded a periphery of the first electrode with a distance of 2 mm between them) for forming the second electrode and the substrate 12 fixed to the metal vapor-deposition chamber were aligned with respect to each other. Then, aluminum was formed with a desired pattern on a surface of the electron-injection layer 36 by a vacuum deposition method. The second electrode 21 having a film thickness of 200 nm was thus formed.

After that, in the same manner as Example 1, an inorganic protection layer, which was made from $SiO_2$ and had a film thickness of 1 µm, was formed with a desired pattern by a sputtering method by use of a shadow mask. The inorganic protection layer was formed to extend from each of edges of the display section 13 by 2 mm to a corresponding sealing area. Further, a parylene film having a film thickness of 2 µm was formed by a vapor-deposition polymerization method on the inorganic layer. The formation of the inorganic layer and the parylene film was carried out 5 times so that a laminate film constituted by 5 layers was formed. The laminate film was used as a sealing film. The panel 11 illustrated in FIG. 2 was thus completed.

Next, three panels 11 thus manufactured were coupled together along long sides of the three panels 11 (the three panels 11 were arranged in a vertical direction), as illustrated in (c) and (d) of FIG. 8, while being aligned with respect to each other by use of markers (alignment sections 16) which were provided (i) in the vicinity of the short sides of the display section 13 and (ii) outside the display section 13.

Note that the adjacent region 12a, provided in the vicinity of one of the long sides, had been already bent before adjacent ones of the three panels were combined with each other.

Lastly, terminals provided in the vicinity of one of the short sides and the terminals provided in the vicinity of one of the long sides were connected to external power sources, respectively. An illumination device (organic EL illumination device), in which a light-emitting region of 492 mm×600 mm was realized by combining adjacent ones of the three display sections 13 with each other, was thus completed.

Here, by supplying, from the external power source, a desired current to an electrode of the organic EL illumination device thus completed, it was confirmed that desired uniform white light was emitted without any defect.

Example 3

Active Driving Organic El Image Display Device

As a substrate 12 (see FIG. 2), a substrate made from an invar material, coated with silicon oxide (thickness: 10 µm), was employed. The substrate had a thickness of 0.1 mm, and had a surface having an area of 750 mm×220 mm.

On a glass substrate, an amorphous silicon semiconductor film was formed by a PECVD method. Then, a crystallizing process was carried out so as to form a polycrystalline silicon semiconductor film. Next, patterning was carried out by use of a photolithography method so that a plurality of island shapes of the polycrystalline silicon semiconductor film were formed. Then, on the polycrystalline silicon semiconductor layer thus patterned, the gate insulating film and the gate electrode layer were formed in this order, and after that, patterning was carried out by use of the photolithography method.

After that, the polycrystalline semiconductor film thus patterned was doped with an impurity element such as phosphorous so as to form a source region and a drain region. A TFT element was thus formed. Then, a flattening film was formed. The flattening film was formed in such a manner that a silicon nitride film was first formed by the PECVD method, and then an acrylic resin layer was formed on the silicon nitride film by use of a spin coater. First, etching was carried out with respect to both the silicon nitride film and the gate insulating film together after the silicon nitride film was formed, so as to form a contact hole which reached the source region and/or the drain region. Then, a source line was formed. After that, the acrylic resin layer was formed, and after that, a contact hole was further formed at the same position as the above contact hole which reached the drain region through the gate insulating film and the silicon nitride film. An active matrix substrate was thus formed. A function of the flattening film was realized by the acrylic resin layer. Note that a capacitor for causing a gate potential of the TFT to be a constant potential was formed in such a manner that an insulating film such as an interlayer insulating film was provided between a drain of the TFT and a source of the TFT.

The active matrix substrate had a contact hole which penetrated the flattening layer. Via the contact hole, a driving TFT, a first electrode of the red light-emitting organic EL element, a first electrode of the green light-emitting organic EL element, and a first electrode of the blue light-emitting organic EL element are electrically connected to each other.

Next, to the contact hole penetrating the flattening layer connected to the TFT for driving each light-emitting pixel, a first electrode (anode) of each pixel was formed by a sputtering method so as to be connected to the contact hole electrically. The first electrode 20 (see FIG. 4) was formed in such a manner that an Al (aluminum) layer having a film thickness of 150 nm and an IZO (indium oxide-zinc oxide) layer having a film thickness of 20 nm were provided in this order.

Then, patterning was carried out with respect to the first electrode by the conventional photolithography method in accordance with each pixel. Here, the first electrode had an area of 300 µm×100 µm. Further, a display section 13 (see FIG. 4) provided on the substrate having a size of 750 mm×220 mm had a size of 742 mm×200 mm, and sealing areas each having a width of 2 mm were provided at upper and lower positions and right and left positions with respect to the display section 13, respectively. Furthermore, a terminal provision region (a region where a V scan 15 is provided in FIG. 2) having a width of 2 mm was provided (i) in the vicinity of one of short sides of the display section 13 having the rectangular shape and (ii) out of the sealing area. Moreover, another terminal provision section (adjacent surface) having a width of 2 mm was provided, as a region (adjacent region) where bending was to be carried out, in the vicinity of one of long sides of the display section 13 having the rectangular shape.

Next, in order to form an edge cover on an edge part of the first electrode 20, $SiO_2$ (thickness: 200 nm) was provided by the sputtering method. Then, patterning was carried out by a conventional photolithography method so that only the edge part of the first electrode 20 was covered with $SiO_2$. According to the present example, a part extending by 10 μm from each of ends of four sides of the rectangular shape was covered with $SiO_2$.

Then, the active matrix substrate was washed. The washing was carried out in such a manner that, for example, ultrasonic washing was carried out for 10 minutes with the use of acetone or IPA, and then UV-ozone washing was carried out for 30 minutes.

Next, the substrate was fixed to a substrate holder provided in an in-line resistance heating vapor-deposition device illustrated in FIG. 5, and a pressure was reduced to be a vacuum (not more than $1\times10^{-4}$ Pa). According to the present example, RGB light-emitting pixels were formed by use of a method in which a material was applied to only a desired part by a mask vapor-deposition method employing a shadow mask 41.

After that, in a desired region, a hole-injection layer 31 (see FIG. 4) was formed by a resistance heating vapor-deposition method by use of 1,1-bis-di-4-tolylamino-phenyl-cyclohexane (TAPC) as a hole-injection material. The hole-injection layer 31 was formed by the method in which a material was applied to only a desired part with the use of a shadow mask. The hole-injection layer 31 had a film thickness of 50 nm at a red light-emitting pixel section, a film thickness of 150 nm at a green light-emitting pixel section, and a film thickness of 100 nm at a blue light-emitting pixel section.

Next, a hole-transport layer 32 (see FIG. 4) having a film thickness of 40 nm was formed by the resistance heating vapor-deposition method by use of N,N'-Di(1-naphthyl)-N, N'-diphenyl-1,1'-biphenyl-1,1'-biphenyl-4,4'-diamine (NPD) as a hole transport material.

Then, in the same manner as Example 1 described above, a red organic light-emitting layer (thickness: 30 nm), a green organic light-emitting layer (thickness: 30 nm), and a blue organic light-emitting layer (thickness: 30 nm) were formed. An organic light-emitting layer 33 was thus formed.

Next, in the same manner as Example 1, a hole-blocking layer 34 (thickness: 10 nm) and an electron-transport layer 35 (thickness: 30 nm) were formed.

After that, a second electrode 21 (see FIG. 4) was formed. First, the substrate was fixed to a metal vapor-deposition chamber. Next, a shadow mask (a mask having an opening for forming the second electrode so that (i) a periphery of the second electrode surrounded a periphery of the entire light-emitting region with a difference of 1 mm between them, and (ii) a periphery of the second electrode surrounded a periphery of a cathode contact area which had been formed on the substrate in advance, with a difference of 1 mm between them) for forming the second electrode and the substrate were aligned with respect to each other. Then, a magnesium-silver (1:9) alloy (film thickness: 19 nm) was formed on a surface of the electron-transport layer 35 by a vacuum deposition method. The translucent second electrode 21 (see FIG. 4) was thus formed.

Next, on the translucent second electrode 21, a protection layer 29 (see FIG. 11), which had a film thickness of 100 nm and was made from SiON, was formed with a desired pattern by an ion plating method by use of a shadow mask. Here, conditions for forming the protection layer 29 were as described below: plasma beam power: 4.0 kW, beam cross-section area S1: 12.56 $cm^2$, beam energy density: 310 $W/cm^2$, $N_2$: 20 sccm, $O_2$: 10 sccm, source material: sintered SiON, density: relative density of not less than 99%.

Next, a sealing substrate in which an adhesive thermoset resin had been applied in advance to a polyimide film, and the active substrate on which the organic EL element had been provided were attached to each other. The attached substrates were heated at 80° C. for 1 hour by use of a hot plate, so as to harden the resin. The process of attaching the substrates to each other was carried out under a dry air condition (water volume: −80° C.) in order to prevent deterioration of the organic EL element due to water.

Then, a polarizer was attached to one of the substrates, from which one of the substrates light was to be taken out. A panel 11 of the present example was thus completed.

Figure 13:
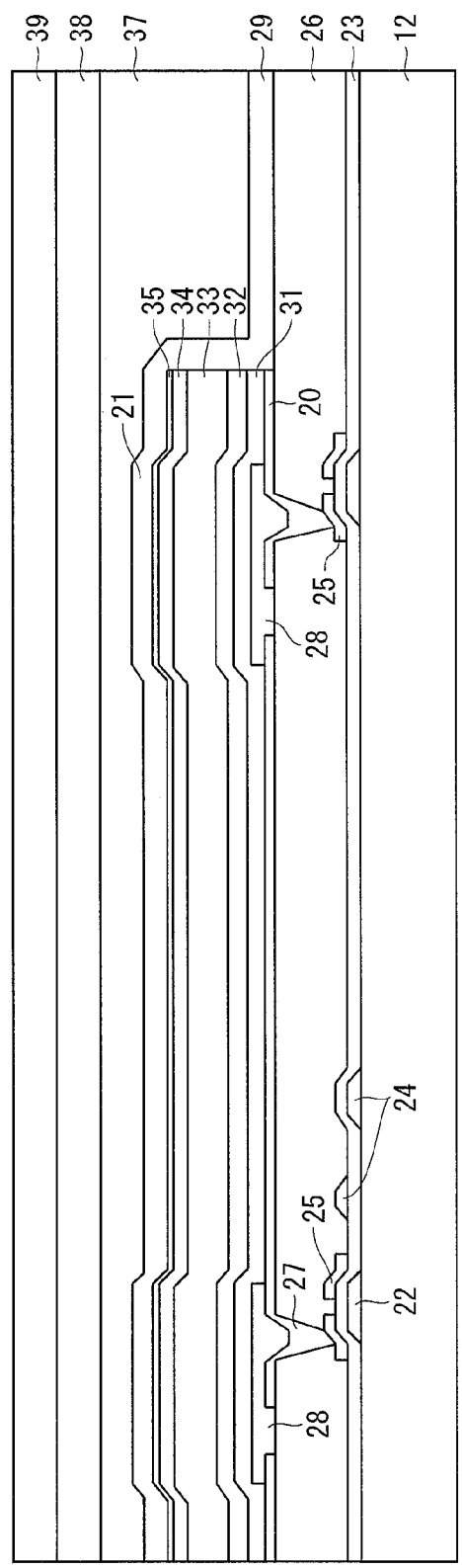
FIG. 13 is a cross-sectional view illustrating an arrangement of a panel in accordance with an example of the present invention.

FIG. 13 is a cross-sectional view illustrating the panel 11 of the present example. In FIG. 13, "22" indicates a gate metal, "23" indicates a gate insulating film, "24" indicates a line, "25" indicates a TFT electrode, "26" indicates a flattening film, "27" indicates a through hole, "37" indicates a thermoset resin, "38" indicates a sealing substrate, and "39" indicates a polarizer.

Next, three rectangular active matrix driving organic El panels thus manufactured were coupled together along long sides of the panels by use of an alignment frame 18 (see FIG. 9) so that the three panels were arranged in a vertical direction.

Note that the adjacent region 12a, provided in the vicinity of one of the long sides, had been already bent before adjacent ones of the three panels were combined with each other.

Lastly, terminals provided in the vicinity of one of short sides of the display section 13 were connected to a power supply circuit via a source driver, and terminals provided in the vicinity of one of the long sides of the display section 13 were connected to another external power source via a gate driver. An active driving organic EL display (image display device) having a display surface of 742 mm×600 mm was thus completed.

By supplying a desired current from the external power source to each pixel in the image display device thus completed, it was confirmed that a desired image was obtained without any defect.

Industrial Applicability

The present invention is optimally applicable to an image display device. In addition, the present invention is applicable to an illumination device or the like. The present invention thus has high industrial applicability.

REFERENCE SIGNS LIST

2: Switching TFT
3: Driving TFT
10: Image display (light-emitting panel device)
11: Panel
12: Substrate (base)
12a: Display section forming region
12a': Flat surface
12b: Adjacent region 12b': Adjacent surface
13: Display section (light-emitting section)
14: H scan
15: V scan
17a: Optical system adjusting substrate
17b: Optical system adjusting substrate
20: First electrode
21: Second electrode
22: Gate metal
23: Gate insulating film
24: Line
25: TFT electrode
26: Flattening film
27: Through hole
28: Edge cover
29: Protection layer
30: Organic layer
31: Hole-injection layer
32: Hole-transport layer
33: Organic light-emitting layer
34: Hole-blocking layer
35: Electron-transport layer
36: Electron-injection layer
37: Thermoset resin
38: Sealing substrate
39: Polarizer
40: Vapor-deposition source
41: Shadow mask

The invention claimed is:

1. A light-emitting panel device comprising:
a plurality of panels each having a rectangular light-emitting section in which a plurality of light-emitting elements are arranged on a surface of a base, each of the plurality of light-emitting elements (i) having a first electrode and a second electrode, and (ii) emitting light by being supplied with a current or a voltage,
the base being curved or bent at one of two edge parts of the surface of the base so as to provide an adjacent surface which (I) projects on a back surface side opposite to the surface and (II) is adjacent to the one of two edge parts of the surface, the two edge parts extending along a pair of long sides constituting the rectangular light-emitting section, respectively,
the adjacent surface being provided with a group of terminals thereon, which extend from the first electrode of each of the plurality of light-emitting elements of the rectangular light-emitting section,
adjacent ones of the plurality of panels being combined with each other in such a manner that (1) a rectangular light-emitting section of one of the plurality of panels and a rectangular light-emitting section of an adjacent one of the plurality of panels are arranged to face in an identical direction, and (2) one of edge parts of a surface of a base of the one of the plurality of panels and one of edge parts of a surface of a base of the adjacent one of the plurality of panels are coupled together so that the rectangular light-emitting section of the one of the plurality of panels and the rectangular light-emitting section of the adjacent one of the plurality of panels are arranged with respect to each other.

2. The light-emitting panel device as set forth in claim 1, wherein:
the one of the plurality of panels and the adjacent one of the plurality of panels are combined with each other in such a manner that (i) the one of edge parts of the surface of the base of the one of the plurality of panels is adjacent to the adjacent surface of the base of the one of the plurality of panels, (ii) the one of edge parts of the surface of the base of the adjacent one of the plurality of panels is opposite to the adjacent surface of the base of the adjacent one of the plurality of panels, and (iii) in the one of edge parts of the surface of the base of the one of the plurality of panels and the one of edge parts of the surface of the adjacent one of the plurality of panels are coupled together.

3. The light-emitting panel device as set forth in claim 1, wherein:
each of the plurality of light-emitting elements is an organic electroluminescence element in which an organic layer including an organic light-emitting layer is provided between the first electrode and the second electrode; and
the group of terminals, extending from the first electrode of each of the plurality of organic electroluminescence elements, are arranged on the adjacent surface along one of the long sides of the rectangular light-emitting section.

4. The light-emitting panel device as set forth in claim 1, wherein:
each of the plurality of panels is arranged such that one of edge parts of the surface of the panel, being on an opposite side with respect to the adjacent surface of the panel, and one of edge parts of the rectangular light-emitting section of the panel, being on the opposite side with respect to the adjacent surface of the panel, overlap each other.

5. The light-emitting panel device as set forth in claim 1, wherein:
no sealing area is provided on the adjacent surface.

6. The light-emitting panel device as set forth in claim 1, wherein:
the base of each of the plurality of light-emitting elements is provided with an alignment section(s) so that bases of the plurality of light-emitting elements are capable of being aligned with respect to each other.

7. The light-emitting panel device as set forth in claim 1, wherein:
a group of terminals extending from the second electrode of each of the plurality of light-emitting elements are arranged on the surface along one of a pair of short sides constituting the rectangular light-emitting section.

8. The light-emitting panel device as set forth in claim 1, wherein:
the base is a plate member.

9. The light emitting panel device as set forth in claim 1, wherein:
the base is a flexible base.

10. The light-emitting panel device as set forth in claim 1, wherein:
the base is made from a metal or plastic.

11. The light-emitting panel device as set forth in claim 1, wherein:
the base is made from an iron-nickel alloy, a linear coefficient of expansion of which is not more than $1\times10^{-5}/°C$.

12. An illumination device comprising:
a light-emitting panel device recited in claim 1,
the rectangular light-emitting section serving as a light source section for emitting illumination light.

13. A method of manufacturing a panel provided in a light-emitting panel device recited in claim 1, the method comprising the steps of:
(a) preparing the base having the surface and the adjacent surface; and
(b) providing, on the surface of the base prepared in said step (a), an organic electroluminescence element serving as a light-emitting element which (i) has a first electrode and a second electrode, and (ii) emits light by being supplied with a current or a voltage, said step (b) including the steps of:

(c) providing the first electrode or the second electrode on the surface; and (d) providing, by use of an in-line vapor deposition method, on the first electrode or the second electrode provided in said step (c), an organic layer so that the organic layer is provided between the first electrode and the second electrode in the organic electroluminescence element.

14. The light-emitting panel device as set forth in claim 1, wherein:

adjacent ones of the plurality of panels being combined with each other in such a manner that one of edge parts of a surface of a base of the one of the plurality of panels and one of edge parts of a surface of a base of the adjacent one of the plurality of panels are coupled together so that a longitudinal direction of the rectangular light-emitting section of the one of the plurality of panels and a longitudinal direction of the rectangular light-emitting section of the adjacent one of the plurality of panels are parallel to each other.

15. An image display device comprising:

a light-emitting panel device recited in claim 1, the rectangular light-emitting section serving as an image display section for displaying an image.

16. The image display device as set forth in claim 15, further comprising:

an active matrix drive element for driving the plurality of light-emitting elements provided in the image display section.

17. The image display device as set forth in claim 15, wherein:

each of the plurality of light-emitting elements provided in the display section is an organic electroluminescence element in which an organic layer including an organic light-emitting layer is provided between the first electrode and the second electrode;

a power source supply line for supplying electric power to the image display section is connected to the second electrode; and a terminal of the power source supply line is arranged on the surface in the vicinity of one of short sides constituting the rectangular light-emitting section serving as the image display section.

18. A panel comprising:

a rectangular light-emitting section in which a plurality of light-emitting elements are arranged on a surface of a base, each of the plurality of light-emitting elements (i) including a first electrode and a second electrode, and (ii) emitting light by being supplied with a current or a voltage, the base being curved or bent at one of two edge parts of the surface of the base so as to provide an adjacent surface which (I) projects on a back surface side opposite to the surface and (II) is adjacent to the one of two edge parts of the surface, the two edge parts extending along a pair of long sides constituting the rectangular light-emitting section, respectively, the adjacent surface being provided with a group of terminals thereon, which extend from the first electrode of the rectangular light-emitting section.

* * * * *